(12) United States Patent
Watarai

(10) Patent No.: US 6,294,932 B1
(45) Date of Patent: Sep. 25, 2001

(54) INPUT CIRCUIT, OUTPUT CIRCUIT, INPUT-OUTPUT CIRCUIT AND METHOD OF PROCESSING INPUT SIGNALS

(75) Inventor: Seiichi Watarai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/455,028

(22) Filed: Dec. 6, 1999

(30) Foreign Application Priority Data

Dec. 7, 1998 (JP) .................................. 10-347654

(51) Int. Cl.[7] .......................................... H03K 19/0175
(52) U.S. Cl. ................. 326/83; 326/86; 326/68; 326/73
(58) Field of Search ................. 326/86, 82, 83, 326/66, 68, 73, 69, 90

(56) References Cited

U.S. PATENT DOCUMENTS

| 5,283,482 | * | 2/1994 | Chen ..................................... 307/475 |
| 5,539,333 | * | 7/1996 | Cao et al. ............................... 326/63 |
| 5,903,167 | * | 5/1999 | Sanwo et al. .......................... 326/86 |

* cited by examiner

Primary Examiner—Michael Tokar
Assistant Examiner—Anh Q. Tran
(74) Attorney, Agent, or Firm—McGuireWoods LLP

(57) ABSTRACT

An input-output circuit in which, even if variations in logic threshold voltages occurs, a logic signal can be exactly recognized on the basis of small-amplitude signals supplied. The input-output circuit of the present invention contains a threshold value detecting circuit, an amplifying section used to output a voltage having amplitude center level of a small-amplitude signal, to amplify the small-amplitude signal to a predetermined amplitude level, to convert the small-amplitude signal to a logic signal (rectangular wave) that can be processed by a CMOS internal circuit and to feed the converted signal through an output terminal to the CMOS internal circuit, a constant current circuit used to change amplification factor of the small-amplitude signal inputted, and a feedback amplifier to compare the amplitude center voltage of the small-amplitude signal with a voltage supplied from the threshold value detectt ing circuit and to feedback a voltage to the constant current circuit so that the amplitude center voltage of the signal amplified by the amplifying section is equal to a voltage set by the threshold value detectt ing circuit.

54 Claims, 9 Drawing Sheets

INPUT CIRCUIT, OUTPUT CIRCUIT, INPUT-OUTPUT CIRCUIT AND METHOD OF PROCESSING INPUT SIGNALS

BACKGROUND OF THE INVENTION

1. Field of the Invention

The present invention relates to an input circuit, an output circuit and an input-output circuit for transmitting a signal between semiconductor devices connected through transmission lines and more particularly to an input circuit, an output circuit and an input-output circuit (hereinafter referred to as an interfacing circuit) enabling signal transmission (or signal interfacing) to be performed at high speed and with less power consumption.

2. Description of the Related Art

In recent years, small-amplitude interfacing specifications including GTL (Gunning Transceiver Logic), CTT (Center Tapped Termination), LVDS (Low Voltage Differential Signaling), PECL (Pseudo Emitter Coupled Logic), PCML and the like are increasingly used for transmitting signals through transmission paths such as bus lines between semiconductor devices composed of two or more integrated circuits.

In the conventional signal transmission, a signal used for the transmission has an amplitude being near to that of a supply voltage being applied to integrated circuits. However, in the interfacing specifications described above, a signal having a specified amplitude which is converted to a small level is transmitted. Taking a case of CMOS (Complementary Metal Oxide Semiconductor) interfacing as an example, an amplitude of a signal being transmitted by the conventional method is generally about 5 V or 3 V, which is approximately equal to that of a supply power voltage applied to integrated circuits or the like.

However, for example, in the case of the LVDS (Low Voltage Differential Signaling) interfacing specifications, an amplitude of a signal to be transmitted is as small as about 0.3 V. In the case of the PECL interfacing specifications, it is about 0.6V.

The reason for making an amplitude of a transmission signal small is that it is clearly attributable to an increase of the transmission speed, lowering of the power consumption and reduction of noise.

In the case of the PECL interfacing specifications, for example, a high-level small-amplitude signal can be generated by allowing a specified current to flow, in an output circuit, through a terminating resistor to a terminating voltage source and thereby producing electromotive force with a specified terminating resistor, while a low-level small-amplitude signal can be generated by allowing a specified current to flow, in an output circuit, through a resistor from a terminating voltage source and thereby producing electromotive force with a specified terminating resistor. Accordingly, a high-level small-amplitude signal to be produced has a voltage level being lower by about 0.3 V with respect to the terminating voltage while a low-level small-amplitude signal has a voltage level being lower by about 0.3 V as well. As a result, a signal having an amplitude of about 0.6 V is produced.

In general, two methods are available for transmitting such small-amplitude signals, one being a single-phase transmission system and the other being a differential-phase transmission system. In the case of the single-phase transmission system, only one small-amplitude signal is used for signal transmitting. On the other hand, in the case of the differential-phase transmission system, in addition to one small-amplitude signal being equivalent to that used by the single-phase transmission system, another small-amplitude signal being in inverse phase is transmitted at the same time, i.e., two small-amplitude signals are simultaneously transmitted.

When a signal is received by the single-phase transmission system, to one of two input terminals mounted on a receiving circuit is supplied a reference voltage being near to a center voltage of an amplitude of the signal and to the other input terminal is inputted the transmission signal, and if the transmission signal having a voltage being higher than the reference voltage is supplied, the transmission signal is judged to be a high-level signal and if the transmission signal having a voltage being lower than the reference voltage is supplied, the signal is judged to be a low-level signal.

When a signal is received by the differential-phase system, two small-amplitude signals including one not being in inverse phase and the other being in inverse phase are transmitted simultaneously and these two signals are inputted to two input terminals mounted on the receiving circuit as they are. If the voltage of the signal inputted to an inversion-phase input terminal is higher than that of the signal inputted to an positive-phase input terminal, the signal is judged to be high, and if the voltage of the signal inputted to the inversion-phase input terminal is lower than that of the signal inputted to the positive-phase input terminal, the signal is judged to be low. The description hereafter is made according to an example using the differential-phase input terminal.

FIG. 7 is a schematic diagram showing one example of a conventional input-output circuit. As shown in FIG. 7, in the input-output circuit, a sending (controlling) integrated circuit 1 is connected through transmission lines 4 and input terminals IN and INB to a receiving (controlled) integrated circuit 2. The integrated circuit 1 has an output circuit 3 adapted to convert, for example, logic signals inputted from an inputting circuit (not shown) or logic signals or the like used to control the integrated circuit 2, to small-amplitude signals and to output the converted signals. The integrated circuit 2 has an input circuit 5 adapted to amplify small-amplitude signals inputted from the integrated circuit 1 to a predetermined amplitude level and a CMOS internal circuit 6 mounted on the same chip as the input circuit 5 is mounted and operated in accordance with a signal fed from the input circuit 5. Each line of the transmission lines 4 is connected to each of terminating resistors Rt and is terminated at a terminating voltage (Vtt) with these terminating resistors Rt. Moreover, there are some interfacing specifications where the terminating resistor Rt is used, however, the terminating voltage Vtt is not applied.

FIG. 8 is a schematic diagram showing one specific example of a conventional input circuit. This conventional circuit is adapted to convert small-amplitude signals (i.e., logic signals or the like to control the CMOS internal circuit 6) fed through the transmission lines 4 from the sending (controlling) integrated circuit 1 to a signal having a predetermined amplitude (VDD full-swing amplitude).

Referring to FIG. 8, signals supplied from the transmission lines 4 are fed to each of gates of p-chanel MOS transistors (hereinafter referred simply to as a pMOS transistor) P1 and P2 constituting an amplifying circuit 21 of the input circuit and the signal amplified by the amplifying circuit 21 is fed through a NodeA to an inverter circuit 22, and the logic signal that has not yet been converted to a small-amplitude signal is fetched from the inverter circuit 22 by the sending (controlling) integrated circuit 1. Moreover, the amplifying circuit 21 and the inverter circuit 22 are formed on the same integrated circuit (a chip).

The amplifying circuit 21 is comprised of a constant current circuit II, pMOS transistors P1 and P2, and nMOS transistors N1 and N2. A drain of the pMOS transistor P1 is connected to a drain of the nMOS transistor N2 and a source of the nMOS transistor N2 is connected to a predetermined reference potential point GND of the receiving (controlled) integrated circuit 2. Similarly, a drain of the pMOS P2 is connected to a drain of the nMOS transistor N1 and a source of the nMOS transistor N1 is connected to the reference potential point GND. Moreover, the drain of the nMOS transistor N1 (the drain of the pMOS transistor P2) is connected to gates of the nMOS transistor N1 and the nMOS transistor N2, and drains of the pMOS transistor P1 and the pMOS transistor P2 are connected through the constant current circuit II to a predetermined direct current supply source VDD of the receiving (controlled) integrated circuit 2.

The inverter circuit 22 is comprised of a pMOS transistor P3 and an nMOS transistor N3. A drain of the pMOS transistor P3 is connected to a drain of the nMOS transistor N3, a source of the nMOS transistor N3 is connected to a reference potential point GND and a drain of the pMOS transistor P3 is connected to a direct voltage supply source VDD. Moreover, the drain of the pMOS transistor P1 (the drain of the nMOS transistor N3) constituting the amplifying circuit 21 is connected through the NodeA to gates of the pMOS transistor P3 and of the nMOS transistor N3 constituting the inverter circuit 22.

Next, by referring to FIG. 9, operations of the conventional input circuit 5 are described. FIG. 9 is a timing chart explaining states of signals flowing each part of the input circuit of FIG. 8.

When small-amplitude signals (such as logic signals or the like), as shown in (a) portion in FIG. 9, are inputted to two input terminals IN and INB of the circuit shown in FIG. 8 through the transmission lines 4 from the sending (controlling) integrated circuit 1, during a period ① in FIG. 9, the pMOS transistor P1 and nMOS transistor N3 are turned OFF and the pMOS transistor P2 and pMOS transistor P3 are turned ON. During a period ② in FIG. 9, the pMOS transistor P1 is changed from an OFF state to ON state and the pMOS transistor P2 is gradually changed from an ON to OFF state. During a period ③ in FIG. 9, the pMOS transistor P1 and nMOS transistor N3 are turned ON and the pMOS transistor P2 and pMOS transistor P3 are turned OFF. During a period ④ in FIG. 9, the pMOS transistor P1 is changed from an ON state to OFF state and the pMOS transistor P2 is gradually changed from an OFF state to ON state. During a period ⑤ in FIG. 9, the pMOS transistor P1 and nMOS transistor N3 are turned OFF and the pMOS transistor P2 and pMOS transistor P3 are turned ON.

After small-amplitude signals (such as logic signals or the like) as shown in (a) portion in FIG. 9, inputted through the two input terminals IN and INB shown in FIG. 8, and via the transmission lines 4 by the sending (controlling) integrated circuit 1a are fed to gates of the pMOS transistors P1 and P2 constituting the amplifying circuit 21, the signals received by the amplifying circuit 21 are transmitted, as shown in (b) portion of FIG. 9, through the NodeA to gates of the pMOS transistor P3 and the nMOS transistor N3. Then, as shown in (c) portion of FIG. 9, the inverter circuit 22 feeds the small-amplitude signals (logic signals or the like to control the CMOS internal circuit 6) supplied via the transmission lines 4 by the sending (controlling) integrated circuit 1 and converted to logic signals each having a predetermined amplitude (VDD full-swing amplitude) to the CMOS internal circuit 6.

Electrical characteristics of transistors formed within the integrated circuit usually are varied due to circuit characteristic variation factors (such as power supply voltages, temperatures and manufacturing processes), and their logic thresholds are varied in a CMOS logic circuit (the inverter circuit 22) in particular. This presents a problem in that a shift occurs in timing for ON/OFF of transistors used in the inverter circuit in particular. Though the amplifying circuit 21 is also affected by the variations in logic threshold voltage caused by variations in the processes of manufacturing the transistors, its influence is less compared with the inverter circuit 22 and therefore only the influence on the inverter circuit 22 is taken into consideration in the descriptions thereafter.

After the small-amplitude signals (i.e., logic signals or the like), as shown in (a) portion of FIG. 9, are inputted to the input terminal IN and INB, if the amplitude levels of the small-amplitude signals inputted to the input terminal IN and INB are inverted during a period between (I) to (III) points, a signal, the amplitude level of which is changed from a level at (I) point to a level at (III) point, as shown in (b) portion of FIG. 9, is fed by the amplifying circuit 21 to the inverter circuit 22 via NodeA. In the (a) portion of FIG. 9, the characters "Voff" represent an amplitude center voltage of the small-amplitude signal and the characters "Vdm" represent an amplitude level of the small-amplitude signal. Moreover, values of the "Voff" and "Vdm" have been predetermined or defined by the above-mentioned small-amplitude interfacing specifications (such as GTL, CTT, LVDS, PECL, PCML or the like).

At this point, if variations in the logic threshold level caused by variations in manufacturing processes do not occur in transistors constituting the inverter circuit 22, the signal inversion point voltage of the inverter circuit 22 becomes the threshold value A shown in (b) portion in FIG. 9 and, as shown in (c) portion of FIG. 9, the output of the inverter circuit 22 is inverted from VDD level to 0 (zero) volts at the amplitude level (threshold value A) of the signal flowing through the NodeA at the point (II) of FIG. 9. Similarly, the output of the inverter circuit 22 is inverted from 0 (zero) volts to VDD level at the amplitude level (the same threshold value A) of the signal flowing the NodeA at the point (II). As a result, during a point between (I) to (V), a rectangular wave, the amplitude level of which is changed from VDD level to 0 (zero) volts, is supplied through the terminal "OUT" to the CMOS internal circuit 6.

On the other hand, even if variations in the logic threshold level caused by variations in manufacturing processes occur in transistors constituting the inverter circuit 22, when the signal inversion point voltage of the inverter circuit 22 becomes high, as shown in (d) in FIG. 9, the output of the inverter circuit 22 is inverted from VDD level to 0 (zero) volts at the amplitude level (threshold value B=value higher than proper level) of the signal flowing through the NodeA during a period between (II) and (III) points of FIG. 9. Similarly, the output of the inverter circuit 22 is inverted from 0 (zero) volts to VDD level at the amplitude level (the same threshold value B) of the signal flowing the NodeA during a period between (IV) and (V) points in FIG. 9.

As a result, a rectangular wave in which the amplitude level is changed from VDD level to 0 (zero) volts during a period from a point when an amplitude level of a signal flowing through the NodeA reaches a threshold value B during a period between (II) and (III) points to a point when an amplitude level of a signal flowing the NodeA reaches a threshold value B during a period between (IV) and (V) points as shown in (b) portion in FIG. 9, i.e., in which delay time variation factors represented as "skew B" in (d) portion as shown in FIG. 9 when the inverter threshold value is at the point B being higher than the proper value A as shown in (c) portion in FIG. 9, occur at the time of a rise and a fall of the signal, is supplied through a terminal OUT to the CMOS internal circuit 6.

Similarly, even if variations in the logic threshold level caused by variations in manufacturing processes occur in transistors constituting the inverter circuit 22, when the signal inversion point voltage (threshold value) of the inverter circuit 22 becomes low, for example, as shown in (e) in FIG. 9, the output of the inverter circuit 22 is inverted from VDD level to 0 (zero) volts at the amplitude level (threshold value C=value lower than proper level) of the signal flowing through the NodeA_during a period between (I) and (II) points. Similarly, a case may occur where the output of the inverter circuit 22 is inverted from 0 (zero) volts to VDD level at the amplitude level (at the threshold value C) of the signal flowing the NodeA during a period between (V) and (VI) points in FIG. 9.

As a result, a rectangular wave in which the amplitude level is changed from VDD level to 0 (zero) volts during a period from a point when an amplitude level of a signal flowing through the NodeA reaches a threshold value C during a period between (I) and (II) points to a point when an amplitude level of a signal flowing the NodeA reaches a threshold value C during a period between (V) and (VI) points as shown in (b) portion in FIG. 9, i.e., in which time variation factors represented as "skew C" as shown in (e) portion in FIG. 9 when the inverter threshold value is at the point C being lower than the proper value A, occur at the time of a rise and a fall of the signal, is supplied through a terminal OUT to the CMOS internal circuit 6.

However, the conventional input-output circuit presents a problem in that, if variations in the logic threshold level caused by variations in manufacturing processes occur in transistors constituting the inverter circuit, when a logic signal is outputted from the inverter circuit to an internal circuit composed of later stage logic circuits or the like, the "skew" (delay time variation factor) occurs in output logic signals. If this occurs, when a period during which the logic signal outputted to the internal circuit remains ON or OFF is shorter than a minimum period, i.e., a minimum pulse period, during which a high or low level signal can be recognized, it is impossible for the internal circuit to exactly recognize the logic signal supplied.

SUMMARY OF THE INVENTION

In view of the above, it is an object of the present invention to provide an input circuit, an output circuit and an input-output circuit which are able to supply a logic signal output allowing a supplied logic signal to be always recognized exactly by internal circuits composed of logic circuits or the like mounted in the latter stage even if variations in logic threshold level occur in transistors constituting an inverter circuit caused by variations in manufacturing processes.

According to a first aspect of the present invention, there is provided an input circuit for transmitting a signal between semiconductor devices with an input stage and an output stage comprising:

a threshold value detecting circuit to detect a threshold value of the output stage;

whereby an amplitude level of a signal fed from the input stage to the output stage in accordance with the threshold value detected by the threshold value detecting circuit.

According to a second aspect of the present invention, there is provided an input circuit for transmitting a signal between semiconductor devices with an input stage and an output stage comprising:

a threshold value detecting circuit to detect a threshold value of the output stage;

whereby the threshold value of the output stage detected by the threshold value detecting circuit and an amplitude center level of a signal fed to the stage from the input stage are detected and compared and whereby currents to be supplied to the input stage are controlled so that both values described above are equal, and an amplitude center level of a signal fed from the input stage is determined in accordance with variations in the threshold value of the output stage detected by the threshold value detecting circuit.

In the foregoing, a preferable mode is one wherein the threshold value detecting circuit of the output stage has a threshold value being equivalent to that of the output stage.

Also, a preferable mode is one wherein the threshold value detecting circuit of the output stage is composed of a CMOS logic circuit having two or more transistors within the same integrated circuit produced by the same manufacturing processes and mounted on the same board.

Moreover, a preferable mode is one wherein the CMOS circuit is comprised of more than one nMOS transistor and more than one pMOS transistor.

According to a third aspect of the present invention, there is provided an input circuit for transmitting a signal between semiconductor devices with an input stage and an output stage wherein an amplitude center level of an output signal from the input stage is converted to a level corresponding to variations in a threshold value of the output stage and the converted signal is fed to the output stage.

According to a fourth aspect of the present invention, there is provided a method for processing an input signal in an input circuit used for transmitting a signal between semiconductor devices and provided with an input stage and an output stage comprising the step of:

changing an amplitude center value of an output signal fed from the input stage to the output stage depending on variations in a threshold value of the output stage.

In the foregoing, it is preferable that an amplitude of an output signal fed from the input stage to the output stage is equal to or more than that of the input signal fed to the input stage.

Also, it is preferable that an amplitude of an output signal fed from the input stage to the output stage is equal to or less than that of the input signal fed to the input stage.

According to a fifth aspect of the present invention, there is provided an output circuit for transmitting a signal between semiconductor devices wherein a signal fed to the output circuit is converted to a signal having a predetermined amplitude level and an amplitude center level to produce a small-amplitude signal for transmission.

According to a sixth aspect of the present invention, there is provided an input-output circuit used between semiconductor devices connected through transmission lines comprising:

an output circuit defined in the fifth aspect of the present invention;

an input circuit defined in any one of the first to third aspect or fourth aspect of the present invention; and transmission lines to connect said output circuit to the input circuit.

According to a seventh aspect of the present invention, there is provided an input circuit for transmitting a signal between semiconductor devices, amplifying a supplied small-amplitude signal to a full-swing amplitude level being equal to or near to that of a power supply voltage and feeding it as a logic signal comprising:

an amplifying section to output an amplitude center voltage of the small-amplitude signal and converting the small-amplitude signal by amplification to a logic signal having a predetermined amplitude level;

a threshold value detecting circuit to detect a signal inversion point voltage of a CMOS logic circuit receiving an output signal from the amplifying section;

a constant current circuit to control amplification factor and amplified signal amplitude center level in the amplifying section; and a feedback amplifier to compare a signal amplitude center voltage outputted from the amplifying section with a signal inversion point voltage of the CMOS logic circuit detected by the threshold value detecting circuit and to feed a voltage back to the constant current circuit so that an amplitude center level of a signal amplified by the amplifying section is equal to the signal inversion point voltage of the CMOS logic circuit.

According to an eighth aspect of the present invention, there is provided an input circuit for transmitting a signal between semiconductor devices, amplifying a supplied small-amplitude signal to a full-swing amplitude level being equal to or near to that of a power supply voltage and feeding it as a logic signal comprising:

an amplitude center voltage detecting circuit to detect the amplitude center level of the small-amplitude signal;

an amplifying circuit to convert the small-amplitude signal by amplification to a logic signal having a predetermined amplitude level;

a constant current circuit to control amplification factor and amplified signal amplitude center level in said amplifying circuit;

a CMOS logic circuit to convert a signal amplified by the amplifying circuit to the logic signal;

a threshold value detecting circuit to a signal inversion point voltage of the CMOS logic circuit; and a feedback amplifier to compare an amplitude center level detected by the amplitude center voltage detecting circuit with a signal inversion point voltage of the CMOS logic circuit detected by the threshold value detecting circuit and to feed a voltage back to the constant current circuit so that an amplitude center voltage of a signal to be amplified by the amplifying circuit is equal to a signal inversion point voltage of the CMOS logic circuit.

According to a ninth aspect of the present invention, there is provided an input circuit for transmitting a signal between semiconductor devices, amplifying a supplied small-amplitude signal to a full-swing amplitude level being equal to or near to that of a power supply voltage and feeding it as a logic signal comprising:

a level conversion circuit to control a center level of the small-amplitude signal;

an amplitude center voltage detecting circuit to an amplitude center level of a signal fed from the level conversion circuit;

a threshold value detecting circuit to detect a signal inversion point voltage of a CMOS logic circuit receiving an output signal from the level conversion circuit;

a constant current circuit to control amounts of voltage to be shifted by the level conversion circuit; and a feedback amplifier to compare an amplitude center voltage outputted by the level conversion circuit with a signal inversion point voltage of the CMOS logic circuit detected by the threshold value detecting circuit and to feed a voltage back to the constant current circuit so that an amplitude center voltage outputted from the level conversion circuit is equal to a signal inversion point voltage of the CMOS logic circuit.

According to a tenth aspect of the present invention, there is provided an input circuit for transmitting a signal between semiconductor devices, amplifying a supplied small-amplitude signal to a full-swing amplitude level being equal to or near to that of a power supply voltage and feeding it as a logic signal comprising:

a level conversion circuit to control a center level of the small-amplitude signal;

an amplitude center voltage detecting circuit to detect a signal amplitude center voltage supplied from the level conversion circuit;

a CMOS logic circuit to convert a signal having a level shifted by the level conversion circuit to the logic signal;

a threshold value detecting circuit to detect a signal inversion point voltage of the CMOS logic circuit;

a constant current circuit to control amounts of voltage to be shifted by the level conversion circuit; and a feedback amplifier to compare an amplitude center voltage outputted by the amplitude center voltage detecting circuit with a signal inversion point voltage of the CMOS logic circuit detected by the threshold value detecting circuit and to feed a voltage back to the constant current circuit so that an amplitude center voltage outputted from the level conversion circuit is equal to a signal inversion point voltage of the CMOS logic circuit.

In the foregoing, a preferable mode is one wherein the threshold value detecting circuit has the same circuit configurations as the CMOS logic circuit, which is comprised of two or more transistors, each being mounted on the same integrated circuit and on the same board and being produced by the same manufacturing processes.

Also, a preferable mode is one wherein the threshold value detecting circuit has a threshold value being equivalent to that of the CMOS logic circuit.

Also, a preferable mode is one wherein the threshold value detecting circuit is composed of a CMOS logic circuit having two or more transistors within the same integrated circuit produced by the same manufacturing processes and mounted on the same board.

Also, a preferable mode is one wherein the CMOS circuit is comprised of more than one nMOS transistor and more than one pMOS transistor.

Furthermore, a preferable mode is one wherein the CMOS circuit is a CMOS inverter circuit.

According to an eleventh aspect of the present invention, there is provided an output circuit for transmitting a signal between semiconductor devices, converting a supplied input signal to a small-amplitude transmission signal on the basis of a specified small-amplitude interfacing specifications and feeding it comprising:

a constant voltage generating circuit to generate a voltage used to set an output center level of the small-amplitude transmission signal;

an output section to detect an output center level from the output transmission signal and to convert an amplitude of the output transmission signal to a predetermined amplitude; and a feedback amplifier to compare an output center level outputted by a constant voltage circuit used to shift an output center level of the supplied transmission signal and by the output section with a voltage generated by said constant voltage generating circuit and to feed a voltage back to the constant current circuit so that an output center level of a small-amplitude signal outputted from the output section is equal to a voltage value set by the constant voltage generating circuit.

According to a twelfth aspect of the present invention, there is provided an output circuit for transmitting a signal between semiconductor devices, converting a supplied input signal to a small-amplitude transmission signal on the basis of a specified small-amplitude interfacing specifications and feeding it comprising:

a reference voltage generating circuit used to produce an output center level voltage of the small-amplitude transmission signal;

an output center voltage detecting circuit to detect an output center level from the output transmission signal;

a constant voltage circuit used to shift an output center level of the output transmission signal;

a feedback amplifier to compare an output center level detected by the output center voltage detecting circuit with a voltage generated by the reference voltage generating circuit and to feed a voltage back to the constant current circuit so that an output center level of the output transmission signal is equal to a voltage value set by the reference voltage generating circuit; and an amplitude level changing circuit to convert an amplitude of the supplied input signal to a predetermined small-amplitude level.

According to a thirteenth aspect of the present invention, there is provided an input-output circuit used between semiconductor devices connected through transmission lines comprising:

an input circuit defined in any one of the seventh to tenth aspect of the present invention;

an output circuit defined in the eleventh or twelfth of the present invention; and transmission lines to connect said output circuit to the input circuit.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
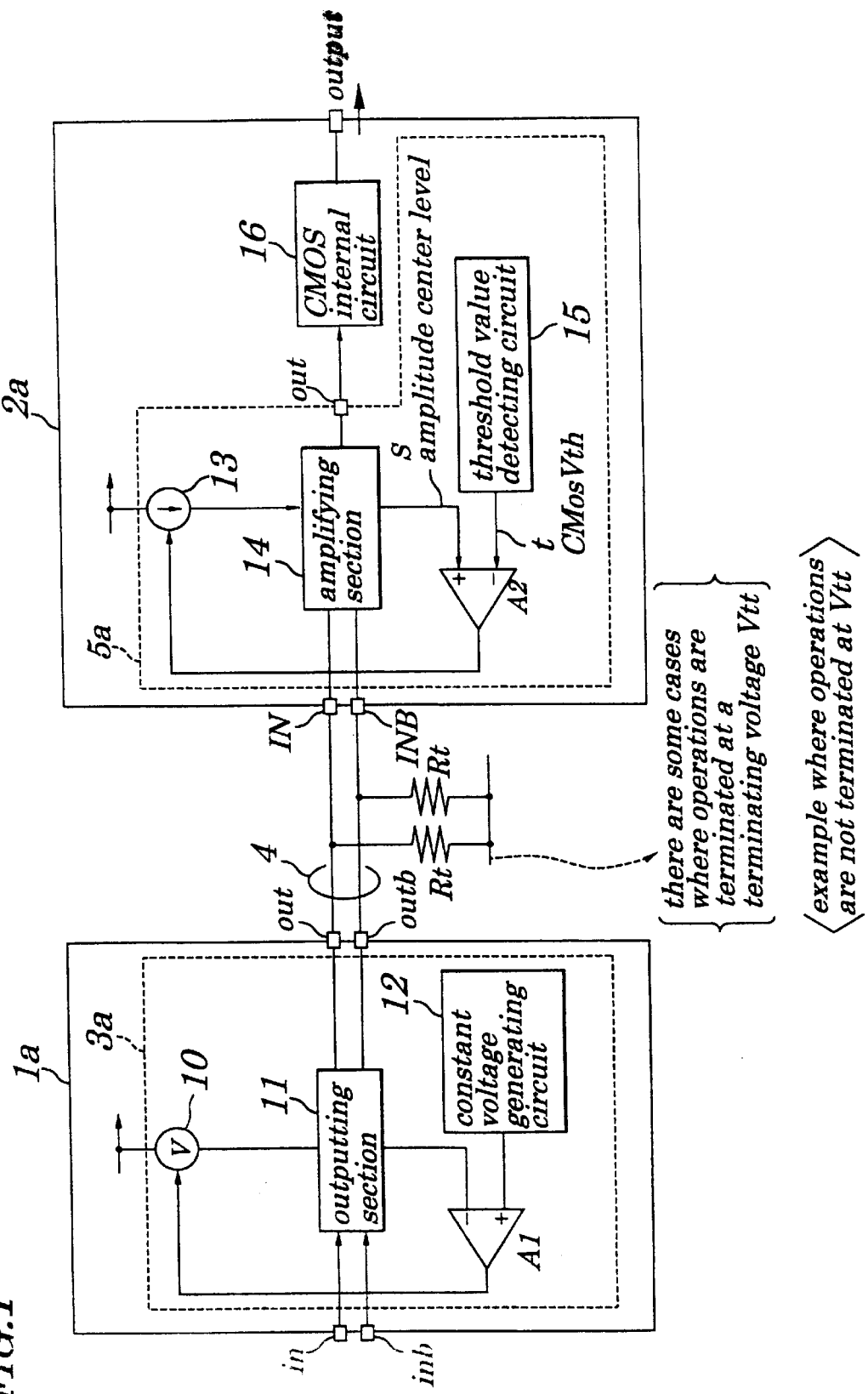
FIG. 1 is a schematic circuit diagram showing electrical configurations of an input-output circuit according to a first embodiment of the present invention.
Figure 2:
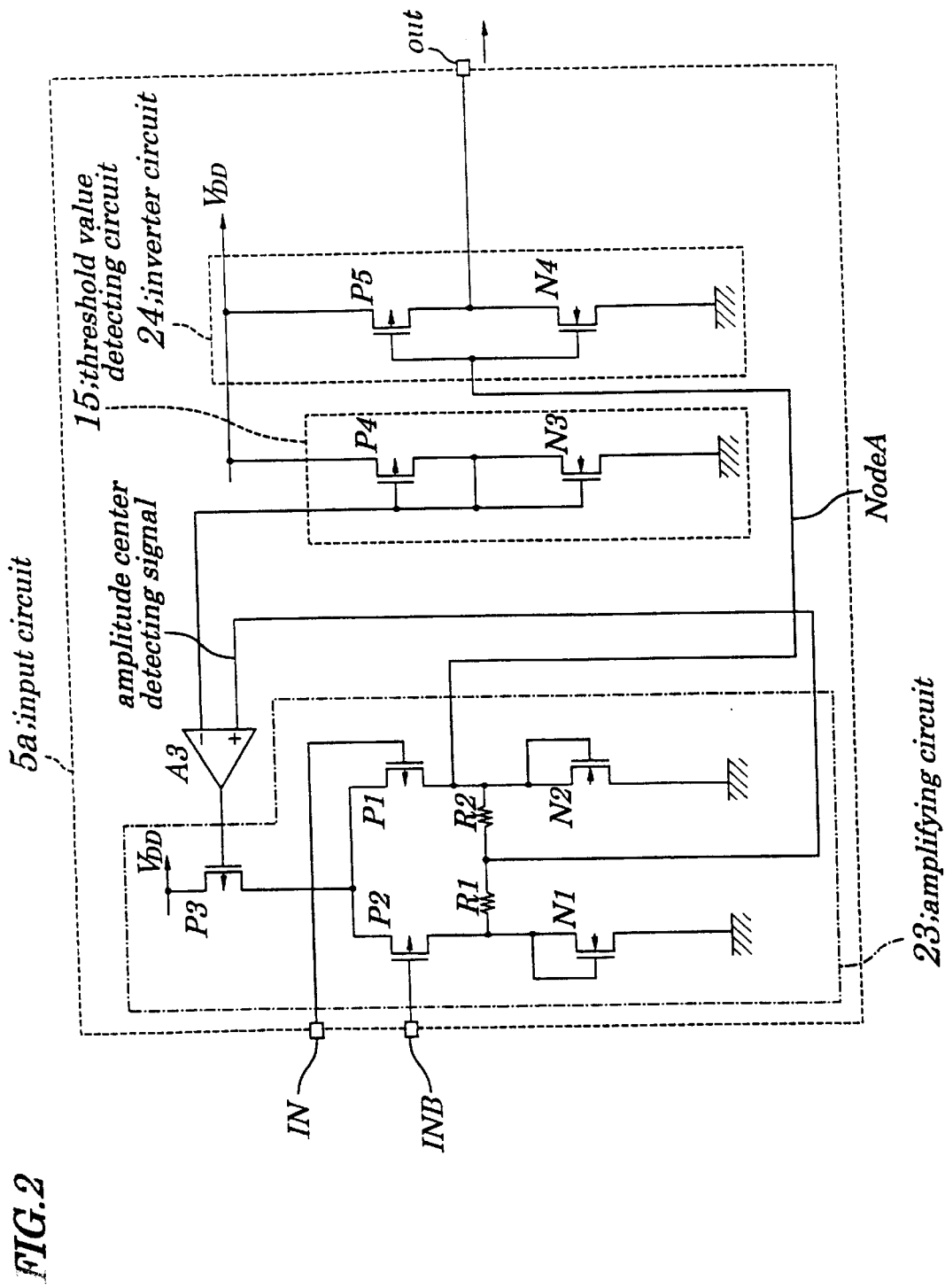
FIG. 2 is a schematic circuit diagram showing specific configurations of an input circuit constituting the input-output circuit of FIG. 1.
Figure 3:
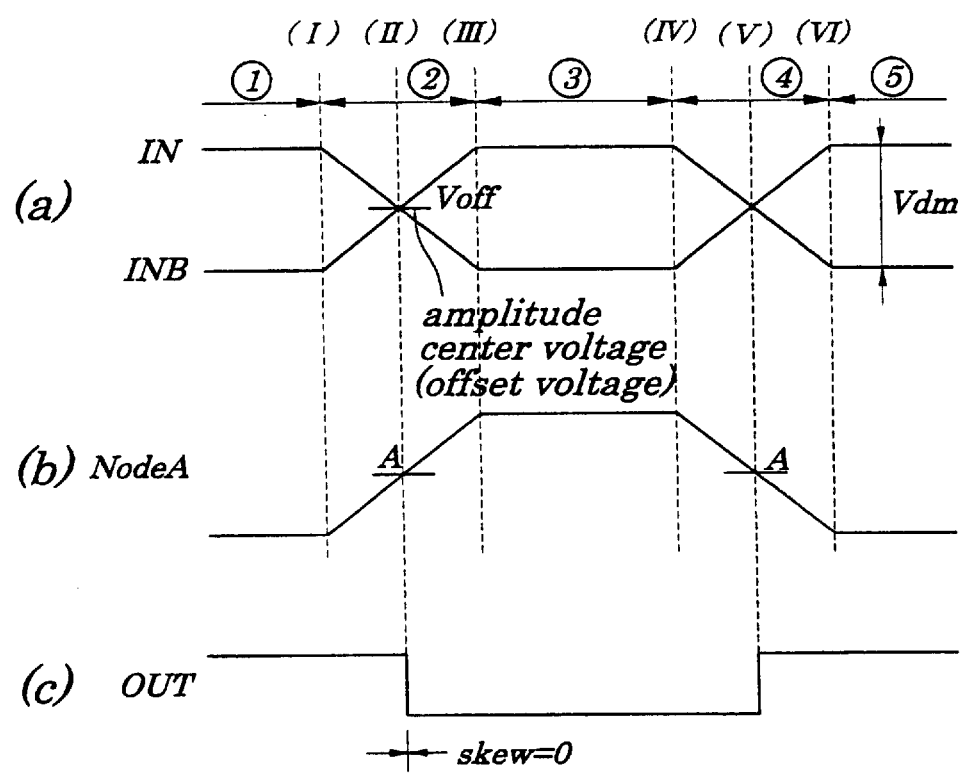
FIG. 3 is a timing chart showing states of signals flowing through each part of the input circuit of FIG. 2.

FIG. 1 is a schematic circuit diagram showing electrical configurations of an input-output circuit according to a first embodiment of the present invention. FIG. 2 is a schematic circuit diagram showing specific configurations of an input circuit constituting the input-output circuit of FIG. 1. FIG. 3 is a timing chart showing states of signals flowing through each part of the input circuit of FIG. 2. As depicted in FIG. 1, the input-output circuit of this embodiment is comprised of a sending (controlling) integrated circuit 1a and a receiving (controlled) integrated circuit 2a, both of which are connected to each other with transmission lines 4 and input terminals IN and INB. The integrated circuit 1a is provided with an output circuit 3a used to convert, for example, logic signals inputted from input terminals "in" and "inb" or signals for controlling the integrated circuit 2a to small-amplitude signals and to output them after wave-shaping. The integrated circuit 2a is provided with an input circuit 5a used to amplify the small-amplitude signals fed by the integrated circuit 1a to a predetermined amplitude level and to output them after wave-shaping and with a CMOS internal circuit 16 mounted on the same chip as the input circuit 5a is mounted thereon and adapted to operate in accordance with signals fed from the input circuit 5a.

The output circuit 3a is comprised of a constant voltage generating circuit 12 adapted to set a center level of an output, an outputting section 11 to convert signals inputted by input terminals "in" and "inb" to predetermined amplitude levels and amplitude center levels using above-described small-amplitude interfaces (GTL, CTT, LVDS, PECL, PCML or the like) and to output them to output terminals "out" and "outb", a constant voltage circuit 10 to shift the output center level of the small-amplitude signals and a feedback amplifier A1 to compare the output center level of signals inputted from the input terminals "in" and "inb" and fed by the outputting section 11 with a voltage supplied by the constant voltage generating circuit 12 and to feed a voltage back to the constant voltage circuit 10 so that the center level of small-amplitude signals outputted to the output terminals "out" and "outb" by the outputting section 11 is equal to the voltage set by the constant voltage generating circuit 12.

The input circuit 5a is comprised of a threshold value detecting circuit 15 adapted to detect a signal inversion point voltage (i.e., a threshold value) of transistors constituting a CMOS logic circuit (including an inverter circuit or the like) which is varied due to variation factors caused by manufacturing processes and the like, an amplifying section 14 adapted to amplify small-amplitude signals inputted from the input terminals IN and INB to a predetermined amplitude level (that is, to a level at which the CMOS internal circuit 16 can be operated), to convert it to a logic signal (having a rectangular wave) which the CMOS internal circuit 16 can process and to supply it to the CMOS internal circuit 16 through the output terminal "out", a constant current circuit 13 adapted to change amplification factor and amplitude center level of the small-amplitude signal inputted from the input terminals IN and INB, a feedback amplifier A2 adapted to compare the amplitude center level of the small-amplitude signal inputted from the input terminals IN and INB with the voltage supplied by the threshold value detecting circuit 15 and to feed a voltage back to the constant current circuit 13 so that the amplitude center level of the signal amplified by the amplifying section 14 is equal to the voltage set by the threshold value detecting circuit 15.

The input circuit 5a of this embodiment, as shown in FIG. 2, is a circuit used to convert the small-amplitude signals (i.e., the logic signal or the like to control the CMOS internal circuit 16) fed from the sending (controlling) integrated circuit 1a through the transmission lines 4 to a predetermined amplitude level (VDD full-swing amplitude)_.

Referring to FIG. 2, signals inputted through the input terminals IN and INB from the transmission lines 4 are fed respectively to each of gates of pMOS transistors P1 and P2 constituting the amplifying circuit 23 (input stage) of the input circuit 5a. The signal amplified by the amplifying circuit 23 is fed to an inverter circuit 24 (output stage) used as one of examples of a CMOS logic circuit through a Node A and the amplitude center level is detected by resistors R1 and R2 and is fed as an amplitude center detecting signal (i.e., having an amplitude center voltage) to a non-inversion input terminal of a feedback amplifier A3.

On the other hand, an inverter threshold value (threshold voltage) is supplied to the non-inversion input terminal of the feedback amplifier A3 by a threshold value detecting circuit 15 used to detect a signal inversion point voltage (i.e., threshold value) and a feedback signal is outputted by the amplifying circuit A3 to the amplifying circuit 23 so that the amplitude center voltage is equal to the inverter threshold value on the basis of the amplitude center detecting signal (amplitude center level) and the inverter threshold value (threshold voltage). Thus, a logic signal that has not yet been converted to the small-amplitude signal is fetched from the inverter circuit 24 by the sending (controlling) integrated circuit 1a.

Moreover, at this point, it is not necessary that the completely same signal is reconstructed; that is, the restored signal is not required to have the same signal amplitude and the same time required for a HIGH to LOW or LOW to HIGH transition as its original one. If a restored signal is logically the same as its original one and if the ratio of a period to hold a signal at a high level to a period to hold a signal at a low level, i.e., the so-called duty-cycle ratio is the same between the restored signal and the original one, it will suffice. The amplifying circuit 23, the inverter circuit 24 and the CMOS internal circuit 16 are mounted on the same integrated circuit (i.e., on the same chip). The amplifying circuit into which a signal is inputted from transmission lines is hereinafter referred to as an input stage and the inverter circuit to which a signal is outputted from the amplifying circuit is hereinafter referred to as an output stage as well.

The amplifying circuit 23 is comprised of pMOS transistors P1, P2 and P3, nMOS transistors N1 and N2, and resistors R1 and R2. The source of the pMOS transistor P3 is connected to a direct voltage supply source VDD of the receiving (controlled) integrated circuit 2a, its the drain is connected to each of the sources of the pMOS transistors P1 and P2 and its gate is connected to an output terminal of the feedback amplifier A3. Moreover, the drain of the pMOS transistor P1 is connected to a drain of the nMOS transistor N2. A source of the nMOS transistor is connected to a predetermined reference potential GND of the receiving (controlled) integrated circuit 2a. Similarly, the drain of the pMOS transistor P2 is connected to a drain of the nMOS transistor N1 and a source of the nMOS transistor N1 is connected to a reference potential GND. Furthermore, a drain of the nMOS transistor N1 (also, the drain of the pMOS transistor P2) is connected to a gate of the nMOS transistor N1 and, through serial circuits composed of the resistor R1 and R2, to the drain of the nMOS transistor N2 (also, a drain of the pMOS transistor P1) and further to a gate of the nMOS transistor N2. The connection point of the resistors R1 and R2 of the serial circuit (i.e., amplitude center voltage detecting circuit) is connected to the non-inversion input terminal of the feedback amplifier A3. The serial circuit comprised of the resistors R1 and R2 is a circuit adapted to detect an offset voltage (amplitude center voltage) of an output signal of the amplifying circuit on the basis of a voltage obtained from the connection point of the resistors R1 and R2.

On the other hand, the inverter circuit 24 is comprised of a pMOS transistor P5 and an nMOS transistor N4. A drain of the pMOS transistor P5 is connected to a drain of the nMOS transistor N4. A source of the nMOS transistor N4 is connected to a reference potential point GND and a source of the pMOS transistor P5 is a direct voltage supply source VDD. The drain of the pMOS transistor P1 constituting the amplifying section (also, the drain of the nMOS transistor N2) is connected to each of the gates of the pMOS transistor P5 and nMOS transistor N4 through NodeA.

The threshold value detecting circuit 15 is composed of a pMOS transistor P4 and an nMOS transistor N3. A drain of the pMOS transistor P4 is connected to a drain of the nMOS transistor N3. A source of the nMOS transistor N3 is connected to a reference potential point GND and a source of the pMOS transistor is connected to a direct voltage supply source VDD. The drain of the pMOS transistor P4 (also, the drain of the nMOS transistor N3) is connected to each of gates of the pMOS transistor P4 and nMOS transistor N3 and to an inversion input terminal of the feedback amplifier A3.

As shown in formulas (1) and (2), a β value (βP4) of the pMOS transistor P4 is equal to a β value (βP5)of the pMOS transistor P5 constituting the inverter circuit 24, while a β value (βN3) of the nMOS transistor N3 is equal to a β value (βN4)of the pMOS transistor N4 constituting the inverter circuit 24.

$$\beta P4 = \beta P5 \tag{1}$$

$$\beta N3 = \beta N4 \tag{2}$$

The β value shown in the above formulas (1) and (2) is given by the following formula:

$$\beta = \mu C_{ox} (W/L) \tag{3}$$

where μ is surface mobility, Cox is capacity per unit area between a gate and a channel, W is an effective channel width and L is an effective channel length.

It is apparent from the above description that each of the transistors constituting the inverter circuit 24 and the threshold value detecting circuit 15 is assembled by the same processes on the same chip.

Next, operations of the input circuit 5a are described by referring to FIGS. 2 and 3.

When small-amplitude signals (such as logic signals or the like), as shown in (a) portion in FIG. 3, are inputted to two input terminals IN and INB of the circuit shown in FIG. 2 through the transmission lines 4 from the sending (controlling) integrated circuit 1a, during a period ① in FIG. 3, the pMOS transistor P1 and nMOS transistor N4 are turned OFF and the pMOS transistor P2 and pMOS transistor P5 are turned ON. During a period ② in FIG. 3, the pMOS transistor P1 in FIG. 2 is changed from an OFF state to ON state and the pMOS transistor P2 is gradually changed from an ON to OFF state. During a period ③ in FIG. 3, the pMOS transistor P1 and nMOS transistor N4 in FIG. 2 are turned ON and the pMOS transistor P2 and pMOS transistor P5 are turned OFF. During a period ④ in FIG. 3, the pMOS transistor P1 in FIG. 2 is changed from an ON state to OFF state and the pMOS transistor P2 is gradually changed from an OFF state to ON state. During a period ⑤ in FIG. 3, the pMOS transistor P1 and nMOS transistor N4 in FIG. 2 are turned OFF and the pMOS transistor P2 and pMOS transistor P5 are turned ON.

After small-amplitude signals (such as logic signals or the like) inputted through the two input terminals IN and INB shown in FIG. 2, and via the transmission lines 4 by the sending (controlling) integrated circuit 1a are fed, as shown in (a) portion of FIG. 3, to gates of the pMOS transistors P1 and P2 constituting the amplifying circuit 23, the signals received by the amplifying circuit 23 are transmitted, as shown in (b) portion of FIG. 3 through the NodeA to gates of the pMOS transistor P5 and the nMOS transistor N4. Then, as shown in (c) portion of FIG. 3, the inverter circuit 24 feeds the small-amplitude signal supplied via the transmission lines 4 by the sending (controlling) integrated circuit 1a and converted to a logic signal (the logic signal or the like to control the CMOS internal circuit) having a predetermined amplitude (VDD full-swing amplitude) to the CMOS internal circuit 16 through an output terminal "out".

Electrical characteristics of transistors formed within the integrated circuit usually are varied due to circuit characteristic variation factors (such as power supply voltages, temperatures and manufacturing processes), and their logic thresholds are varied in a CMOS logic circuit (the inverter circuit 22) in particular. This presents a problem in that a shift occurs in timing for ON/OFF of transistors used in the inverter circuit in particular. In the present invention, this problem is solved by controlling a voltage so that an offset voltage (i.e., amplitude center voltage) of an output signal in the amplifying circuit 23 is equal to an inverter threshold value (i.e., a threshold voltage) supplied by the threshold value detecting circuit 15. Detailed description thereof is given hereinafter.

In FIG. 2, an offset voltage (i.e., amplitude center voltage) of an output signal of the amplifying circuit 23 is obtained from a connection point between the resistors R1 and R2 constituting the serial circuit of the amplifying circuit, and a signal having this voltage is then fed as an amplitude center detecting signal to the non-inversion input terminal of the feedback amplifier A3. On the other hand, as described above, the inverter threshold value (i.e., the threshold voltage) is obtained from the threshold value detecting circuit 15 constructed so as to be physically (and electrically) equivalent to the inverter circuit 24, which is then fed to the inversion input terminal of the feedback amplifier A3.

The feedback amplifier A3 is adapted to output a feedback signal to a gate of the pMOS transistor P3 constituting the amplifying circuit 23 on the basis of the amplitude center detecting signal (having an amplitude center level) supplied to the non-inversion input terminal and the inverter threshold value (i.e., the threshold voltage) supplied to the inversion input terminal so that the amplitude center voltage of a signal amplified by the amplifying circuit 23 (i.e., the amplitude center voltage being the offset voltage of an output signal of the amplifying circuit to be obtained from the connection point between the resistors R1 and R2) is equal to the inverter threshold value (i.e., the threshold voltage).

The pMOS transistor P3 to which the feedback signal is fed is adapted, as described above, to change a current to be supplied in such a manner that an amplitude center voltage is equal to an inverter threshold value (i.e., the threshold voltage).

Thus, the amplifying circuit 23 feeds its output signal being not influenced by variations in logic threshold levels caused by circuit characteristic variation factors (such as power supply voltages, temperatures and manufacturing processes), i.e., corrected output signal, through the NodeA to gates of the pMOS transistor P5 and the nMOS transistor N4 constituting the inverter circuit 24. This allows the sending (controlling) integrated circuit 1a to fetch a logic signal being logically equal to a logic signal which has not yet been converted to the small-amplitude signal, from the inverter circuit 24.

By referring to FIG. 3, operations of the input circuit 5a of this embodiment are described in detail.

After the small-amplitude signals (i.e., logic signals or the like), as shown in (a) portion of FIG. 3, are inputted to the input terminal IN and INB, if the amplitude levels of the small-amplitude signals inputted to the input terminal IN and INB are inverted during a period between (I) to (III) points, a signal, the amplitude level of which is changed from a level at (I) point to a level at (III) point, as shown in (b) portion of FIG. 3, is fed by the amplifying circuit 23 to the inverter circuit 24 via NodeA. In the (a) portion of FIG. 3, the characters "Voff" represent an amplitude center voltage of the small-amplitude signal and the characters "Vdm" represent an amplitude level of the small-amplitude signal. Moreover, values of the "Voff" and "Vdm" have been predetermined or defined by the above-mentioned small-amplitude interfacing specifications (such as GTL, CTT, LVDS, PECL, PCML or the like) in the same manner as in the conventional methods.

At this point, even if variations in the logic threshold level caused by variations in manufacturing processes occur in transistors constituting the inverter circuit 24, the signal inversion point voltage of the inverter circuit 24 is equal to the threshold value A, i.e., a voltage at the point (II) and, as shown in (c) portion of FIG. 3, the output of the inverter circuit 24 is inverted from VDD level to 0 (zero) volts at the amplitude level (threshold value A) of the signal flowing through the NodeA at the point (II) of FIG. 3. Similarly, the output of the inverter circuit 24 is inverted from 0 (zero) volts to VDD level at the amplitude level (the same threshold value A) of the signal flowing the NodeA. As a result, during a period from (I) to (V) points, a rectangular wave, the amplitude level of which is changed from VDD level to 0 (zero) volts, is supplied through the terminal "out" to the CMOS internal circuit 16.

Second Embodiment

Figure 4:
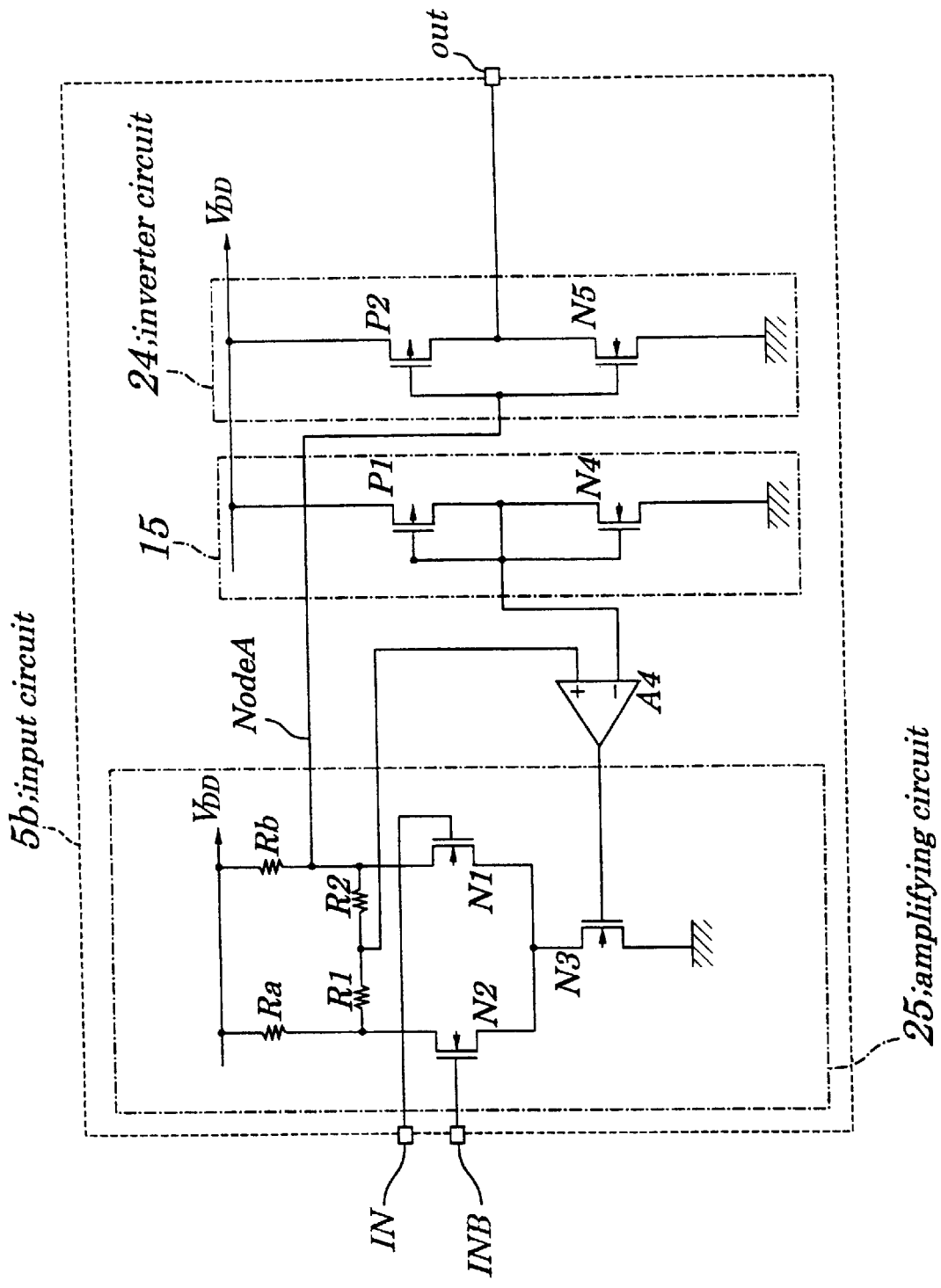
FIG. 4 is a schematic circuit diagram showing specific configurations of an input circuit according to a second embodiment of the present invention.

FIG. 4 is a schematic circuit diagram showing specific configurations of an input circuit according to a second embodiment of the present invention. In an input circuit 5b, signals are fed to gates of an nMOS transistor N1 and an nMOS transistor N2 constituting an amplifying circuit 25 (an input stage) of the input circuit 5b. The signal amplified by the amplifying circuit 25 is fed to an inverter circuit 24 (an output stage) where an amplitude center voltage of the signal is detected and is supplied as an amplitude center detecting signal to a non-inversion input terminal of a feedback amplifier A4. On the other hand, to an inversion input terminal of the feedback amplifier A4 is fed an inverter threshold value (i.e., threshold voltage) from a threshold value detecting circuit 15 which is used to detect a signal inversion point voltage (a threshold value) of the inverter circuit 24. The feedback amplifier A3 is adapted to output a feedback signal to the amplifying circuit 25 on the basis of the amplitude center detecting signal (indicating amplitude center level) supplied by the non-inversion input terminal and an inverter threshold value (i.e., a threshold voltage) supplied by the inversion input terminal so that an amplitude center voltage of the signal amplified by the amplifying circuit 25 is equal to the inverter threshold voltage. This allows the sending (controlling) integrated circuit 1a to fetch a logic signal which has not yet been converted to the small-amplitude signal, from the inverter circuit 24.

Moreover, at this point, it is not necessary that the completely same signal is reconstructed; that is, the restored signal is not required to have the same signal amplitude and the same time required for a HIGH to LOW or LOW to HIGH transition as its original one. If a restored signal is logically the same as its original one and if the ratio of a period to hold a signal at a high level to a period to hold a signal at a low level, i.e., the so-called duty-cycle ratio is the same between the restored signal and the original one, it will suffice. The amplifying circuit 25 and the inverter circuit 24 of this embodiment are mounted on the same integrated circuit (i.e., the same chip).

The amplifying circuit 25 is comprised of nMOS transistors N1, N2 and N3, and resistors R1, R2, Ra and Rb. One end of each of the resistors Ra and Rb is connected to a predetermined direct voltage supply source VDD of a receiving (controlled) integrated circuit 2a, the other end of the resistor Ra is connected to a drain of the nMOS transistor N2 and the other end of the resistor Rb is connected to a drain of the nMOS transistor N1. Moreover, the drains of the nMOS transistor N1 and N2 are connected to a drain of an nMOS transistor N3, a source of the nMOS transistor N3 is connected to a predetermined reference potential point GND of the receiving (controlled) integrated circuit 2a and its gate is connected to an output terminal of the feedback amplifier A4. The drain of the nMOS transistor N1 is connected via a serial circuit composed of the resistors R1 and R2 to the drain of the nMOS transistor N2. A connection point between the resistors R1 and R2 constituting the serial circuit (i.e., an amplitude center voltage detecting circuit) is connected to a non-inversion input terminal of the feedback amplifier A4. The serial circuit comprised of the resistors R1 and R2 is used to detect an offset voltage (i.e., amplitude center voltage) of an output signal from the amplifying circuit on the basis of a voltage obtained from the connection point between the resistors R1 and R2.

On the other hand, the inverter circuit 24 is comprised of a pMOS transistor P2 and an nMOS transistor N5. A drain of the pMOS transistor P2 is connected to a drain of the nMOS transistor N5, a source of the nMOS transistor N5 is connected to a reference potential point GND and a drain of the pMOS transistor is connected to a direct voltage supply source VDD.

The drain of the nMOS transistor N1 constituting the amplifying circuit is connected through a NodeA to gates of the pMOS transistor P2 and nMOS transistor N5.

The threshold value detecting circuit 15 is comprised of a pMOS transistor P1 and an nMOS transistor N4. A drain of the pMOS transistor P1 is connected to a drain of the nMOS transistor N4, a source of the iMOS transistor N4 is connected to a reference potential point GND and a drain of the pMOS transistor P1 is connected to a direct voltage supply source VDD.

Moreover, the drain of the pMOS transistor P1 (the drain of the nMOS transistor N4) is connected to gates of the pMOS transistor P1 and the nMOS transistor N4 and to the inversion input terminal of the feedback amplifier A4. A $\beta$ value ($\beta$P1) of the pMOS transistor P1 is equal to a $\beta$ value ($\beta$P2) of the pMOS transistor P2 constituting the inverter circuit 24, while a $\beta$ value ($\beta$N4) of the nMOS transistor N4 is equal to a $\beta$ value ($\beta$N5)of the pMOS transistor N5 constituting the inverter circuit 24, and each transistor is manufactured through the same process on the same chip.

By referring to FIG. 4, operations of the input circuit 5b of this embodiment are described below.

In FIG. 4, an offset voltage (i.e., an amplitude center voltage) of an output signal of the amplifying circuit 25 is obtained from a connection point between the resistors R1 and R2 constituting the serial circuit of the amplifying circuit 25, and a signal having this voltage is then fed as an amplitude center detecting signal to the non-inversion input terminal of the feedback amplifier A4. On the other hand, as described above, an inverter threshold value (i.e., the threshold voltage) is obtained from the threshold value detecting circuit 15 constructed so as to be physically (and electrically) equivalent to the inverter circuit 24, which is then fed to the inversion input terminal of the feedback amplifier A4.

The feedback amplifier A4 is adapted to output a feedback signal to the gate of the pMOS transistor N3 constituting the amplifying circuit 25 on the basis of the amplitude center detecting signal (having an amplitude center voltage) supplied to the non-inversion input terminal and the inverter threshold value (i.e., the threshold voltage) supplied to the inversion input terminal so that the amplitude center voltage of a signal amplified by the amplifying circuit 25 (i.e., the amplitude center voltage being the offset voltage of an output signal of the amplifying circuit to be obtained from the connection point between the resistors R1 and R2) is equal to the inverter threshold value (i.e., the threshold voltage).

The pMOS transistor N3 to which the feedback signal is fed is adapted, as described above, to change a current to be supplied in such a manner that an amplitude center voltage is equal to the inverter threshold value (i.e., the threshold voltage).

Thus, the amplifying circuit 25 feeds its output signal being not influenced by variations in logic threshold levels caused by circuit characteristic variation factors (such as power supply voltages, temperatures and manufacturing processes), i.e., corrected output signal, from the drain of the nMOS transistor N1 through the NodeA to gates of the pMOS transistor P2 and the nMOS transistor N5 constituting the inverter circuit 24. This allows the sending (controlling) integrated circuit 1a to fetch a logic signal being logically equal to a logic signal which has not yet been converted to the small-amplitude signal, from the inverter circuit 24. Thus, the amplifying circuit 23 feeds its output signal being not influenced by variations in logic threshold levels caused by circuit characteristic variation factors (such as power supply voltages, temperatures and manufacturing processes), i.e., corrected output signal, through the NodeA to gates of the pMOS transistor P5 and the nMOS transistor N4 constituting the inverter circuit 24. This allows the sending (controlling) integrated circuit 1a to fetch a logic signal being logically equal to a logic signal which has not yet been converted to the small-amplitude signal, from the inverter circuit 24.

Third Embodiment

Figure 5:
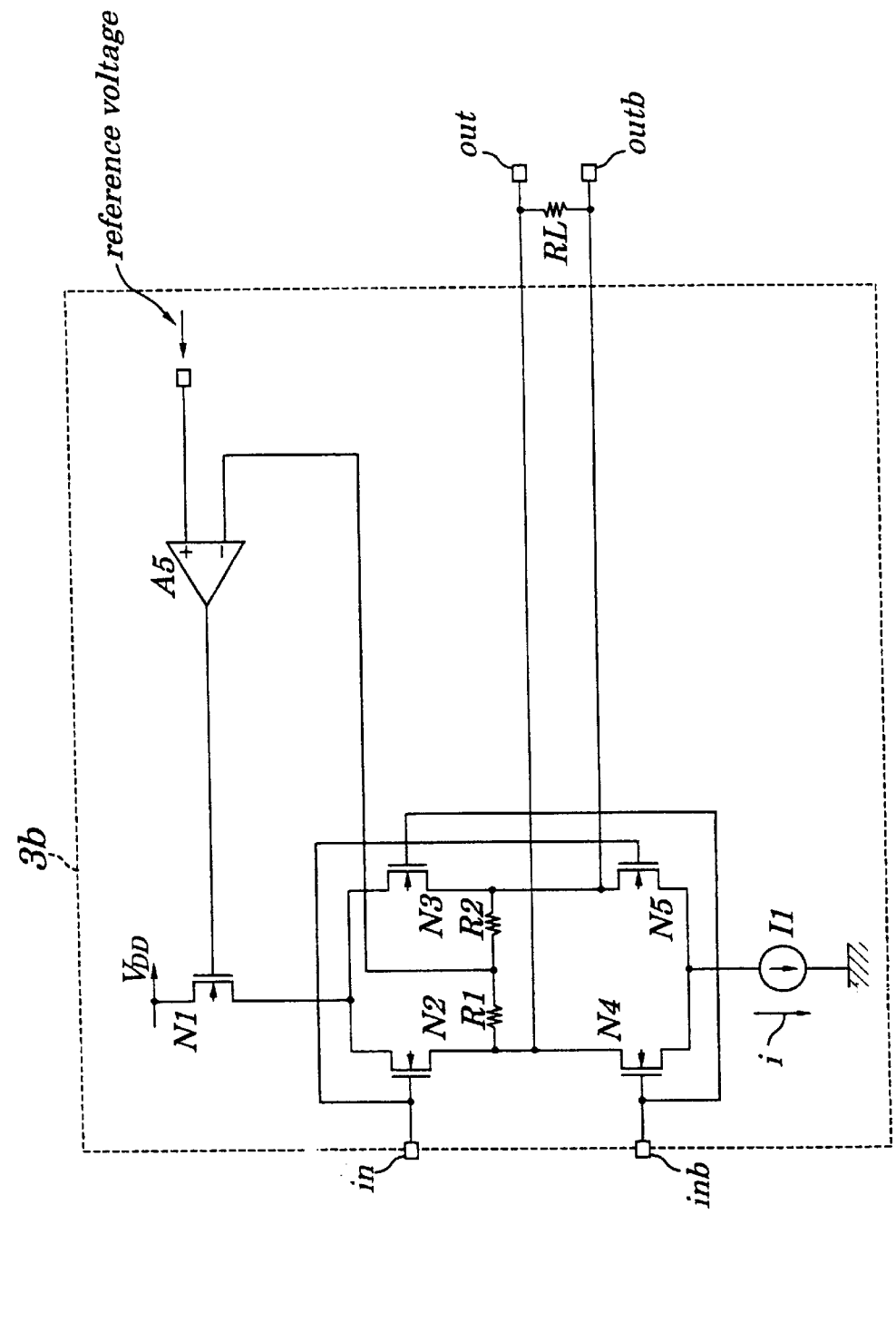
FIG. 5 is a schematic circuit diagram showing specific configurations of an output circuit (small-amplitude output circuit) according to a third embodiment of the present invention.

FIG. 5 is a schematic circuit diagram showing specific configurations of an output circuit 3b (small-amplitude output circuit) according to a third embodiment of the present invention. The output circuit 3b is comprised of nMOS transistors N1, N2, N3, N4 and N5, resistors R1 and R2 and a constant current circuit II. A drain of the nMOS transistor N1 is connected to a predetermined direct voltage supply source VDD of the sending integrated circuit, its source is connected to each of drains of the nMOS transistor N2 and N3 and its gate is connected to an output terminal of the feedback amplifier A5. A source of the nMOS transistor N2 is connected to a drain of the nMOS transistor N4, a source of the nMOS transistor N3 is connected to a drain of the nMOS transistor N5 and each of sources of the nMOS transistors N4 and N5 is connected through the constant current circuit II to a predetermined reference potential point GND of the sending integrated circuit.

Moreover, the drain of the nMOS transistor N4 (the source of the nMOS transistor N2) is connected through a serial circuit composed of resistors R1 and R2 to the drain of the nMOS transistor N5. A connection point between the resistors R1 and R2 constituting the serial circuit is connected to an inversion input terminal of the feedback amplifier A5. The serial circuit composed of the resistors R1 and R2 is used to detect an offset voltage (i.e., the amplitude center voltage) of an output signal of the output circuit 3b on the basis of a voltage obtained from the connection point between the resistors R1 and R2.

Furthermore, an outboard resistor RL (to be mounted outside the chip and to serve as an amplitude changing circuit) is provided in parallel to the serial circuit composed of the resistors R1 and R2 and each end of them is connected to each of output terminals "out" and "outb" respectively. To a non-inversion input terminal of the feedback amplifier A5 is connected a predetermined reference voltage used to determine an amplitude center voltage Voff of a small-amplitude signal in accordance with small-amplitude interfacing specifications used.

In an output circuit 3b of this embodiment, each of signals fed through input terminals "in" and "inb" to the nMOS transistors N2 and N5 constituting the output circuit 3b and to gates of the nMOS transistors N3 and N4. An amplitude center voltage Voff and an amplitude level Vdm of signals inputted are determined in accordance with the used small-amplitude interfaces (GTL, CTT, LVDS, PECL, PCML or the like) and the inputted signals are then converted to small-amplitude signals within specs and are outputted to the input circuit 5a from the output terminals "out" and "outb" through transmission lines 4.

Figure 6:
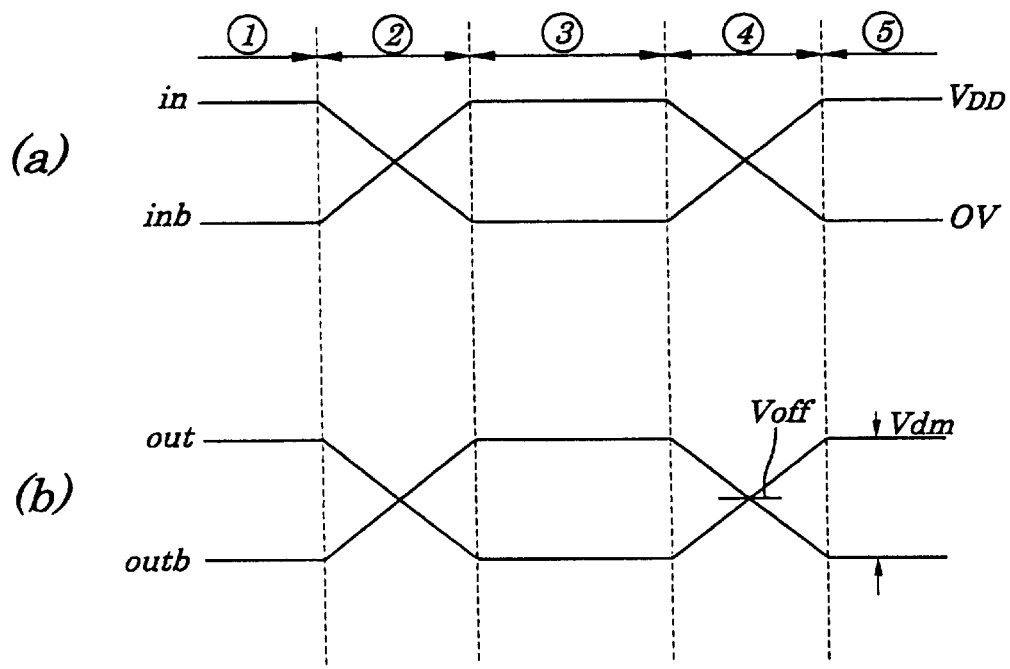
FIG. 6 is a timing chart explaining operations of the output circuit of FIG. 5.
Figure 7:
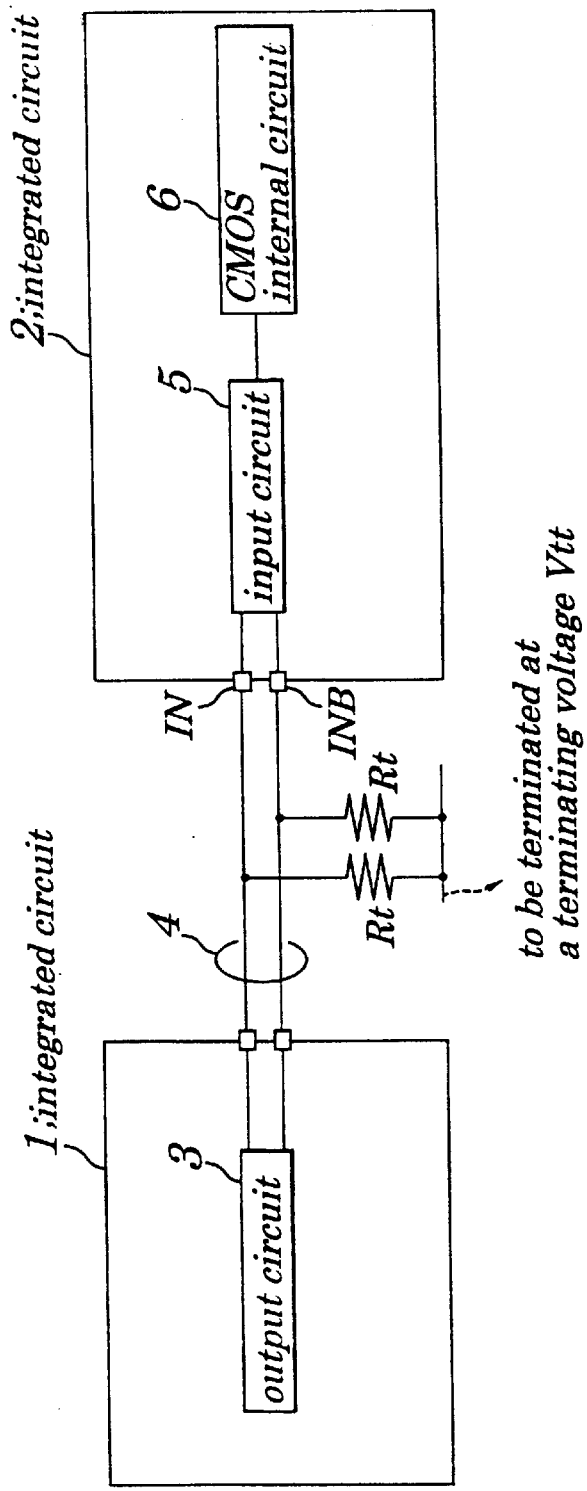
FIG. 7 is a schematic diagram showing one example of a conventional input-output circuit.
Figure 8:
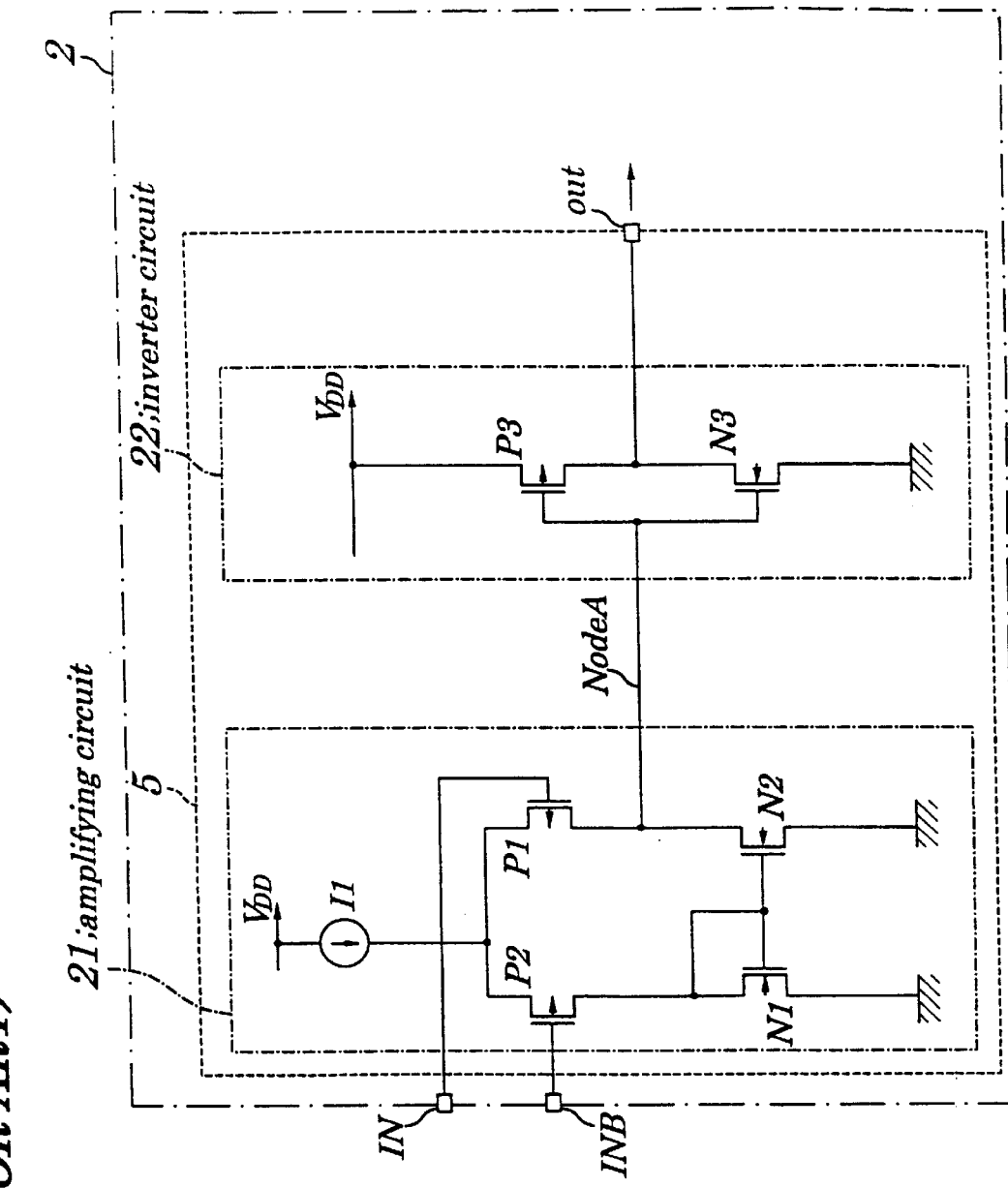
FIG. 8 is a schematic diagram showing one specific example of a conventional input circuit.
Figure 9:
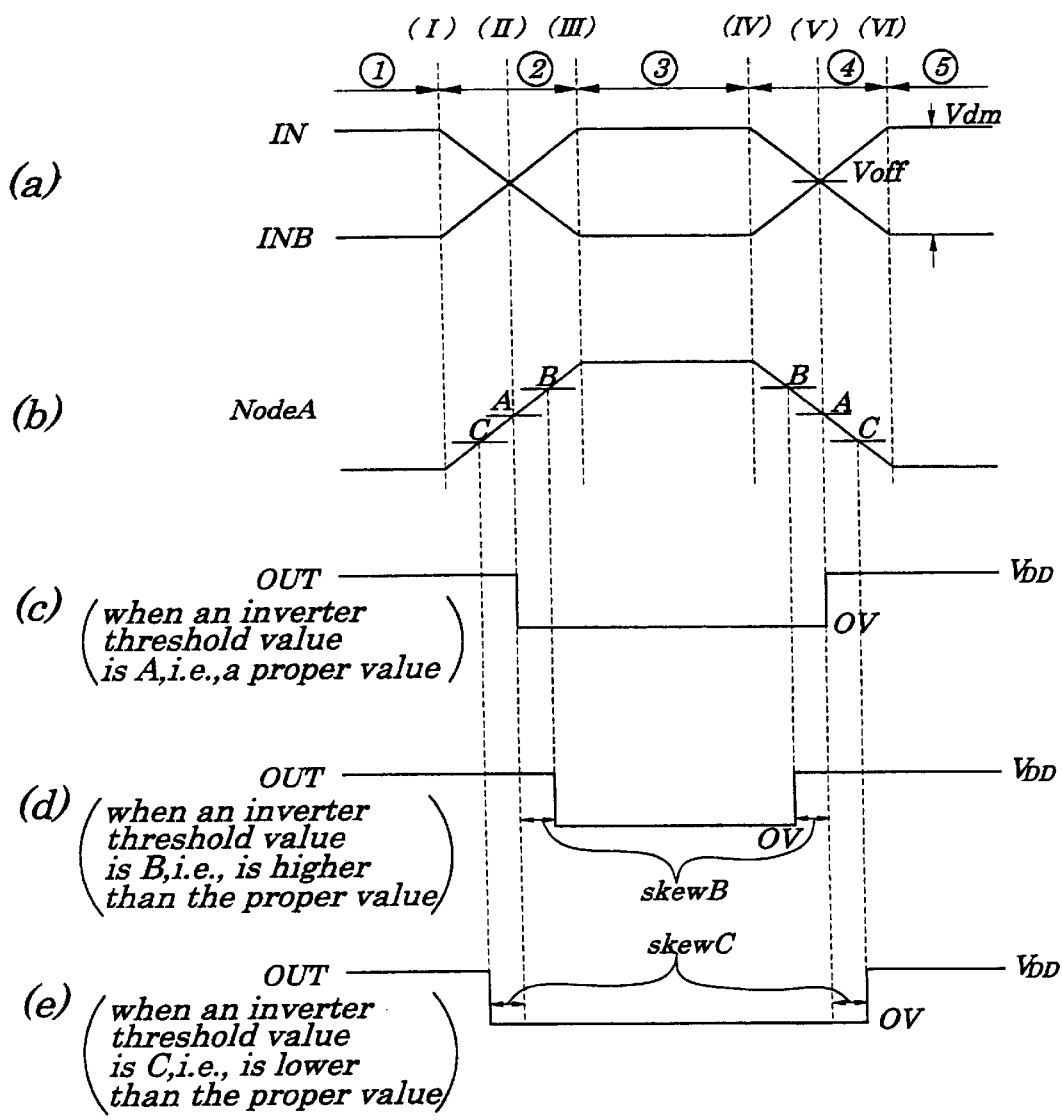
FIG. 9 is a timing chart explaining operations of the input circuit of FIG. 8.

FIG. 6 is a timing chart explaining one example of input signals inputted to input terminals "in" and "inb" and one example of output signals outputted to output terminals "out" and "outb" of the output circuit 3b. By referring to FIGS. 5 and 6, operations of these examples are hereinafter described.

When signals as shown in (a) portion in FIG. 6 are inputted to two input terminals "in" and "inb" of the output circuit 3b, during a period ① in FIG. 6, the nMOS transistors N3 and N4 are turned OFF and the nMOS transistors N2 and N5 are turned ON, and the current "i" flowing through the circuit passes, in turn, through the nMOS transistor N1, nMOS transistor N2, resistor RL, nMOS transistor N5 and a path of a constant current circuit II, causing a HIGH signal to be outputted from the output terminal "out" and a LOW signal to be outputted from the output terminal "outb" as shown in (b) portion in FIG. 6.

During a period ② in FIG. 6, the nMOS transistors N3 and N4 change from an OFF to ON state while the nMOS transistors N2 and N5 change from an ON to OFF state, causing output signals as shown in (b) portion in FIG. 6 to be outputted. During a period ③ in FIG. 6, the nMOS transistors N3 and N4 are turned ON and the nMOS transistors N2 and N5 are turned OFF, and the current "i" flowing through this circuit passes, in turn, through the nNOS transistor N1, nMOS transistor N3, resistor RL, nMOS transistor N4 and a path of a constant current circuit II, causing a LOW signal to be outputted from the output terminal "out" and a HIGH signal to be outputted from the output terminal "outb" as shown in (b) portion in FIG. 6.

During a period ④ in FIG. 6, the nMOS transistors N3 and N4 change from an ON to OFF state while the nMOS transistors N2 and N5 change from an OFF to ON state, causing output signals as shown in (b) portion in FIG. 6 to be outputted. During a period ⑤ in FIG. 6, the nMOS transistors N3 and N4 are turned OFF and the nMOS transistors N2 and N5 are turned ON, and the current "i" flowing through this circuit passes, in turn, through the nMOS transistor N1, nMOS transistor N2, resistor RL, nMOS transistor N5 and a path of a constant current circuit II, causing a HIGH signal to be outputted from the output terminal "out" and a LOW signal to be outputted from the output terminal "outb" as shown in (b) portion in FIG. 6.

Next, a description is given as to how the amplitude center voltage Voff and the amplitude level Vdm of the output signal (small-amplitude signal) as shown in (b) portion in FIG. 6 to be outputted from output terminals "out" and "outb" in response to the input signals to be inputted to the input terminals "in" and "inb" in the output circuit 3b in FIG. 5, are determined.

First, as described above, an offset voltage (an amplitude center voltage) of output signals of the output circuit 3b is obtained from the connection point between resistors R1 and R2 constituting the serial circuit, which is supplied to the inversion input terminal of the feedback amplifier A5 and, on the other hand, to the non-inversion input terminal of the feedback amplifier A5 is applied a reference voltage to determine the amplitude center voltage Voff of the small-amplitude signal defined by the small-amplitude interfacing specifications.

The feedback amplifier A5 is adapted to output a feedback signal to the gate of the nMOS transistor N1 so that the amplitude center voltage outputted by the output circuit 3b (i.e., the amplitude center voltage being the offset voltage of the output signal of the output circuit 3b obtained from the connection point between the resistors R1 and R2) is equal to the amplitude center voltage Voff determined by the predetermined reference voltage, on the basis of the offset voltage (i.e., the amplitude center voltage) of the output signal of the output circuit 3b supplied to the inversion input terminal and the reference voltage used to determine the amplitude center voltage Voff of the small-amplitude signals, defined by the small-amplitude interfaces, supplied to the non-inversion input terminal. As a result, the nMOS transistor N1 to which the above feedback signal is fed is adapted to change a voltage to be shifted so that the amplitude center voltage of the signal outputted by the output circuit 3b is equal to the amplitude center voltage Voff, causing a signal with its amplitude center voltage to be set to Voff as shown in (b) portion in FIG. 6 to be outputted.

To determine the amplitude level Vdm, a current value flowing through the constant current circuit II is changed. The amplitude level Vdm is given by the following formula:

$$Vdm = RL \times i \quad (4)$$

Therefore, by setting the value of the current flowing through the constant current circuit II so that the amplitude level Vdm of the small-amplitude signal defined by the small-amplitude interfaces is obtained, a signal with its amplitude level set to Vdm as shown in (b) portion in FIG. 6 is outputted by the output circuit 3b. In the above formula (4), RL represents a resistance value of the outboard resistor (i.e., mounted outside the chip) and "i" represents a current value flowing through the constant current circuit II.

As described above, according to the input-output circuit of the present invention, even in the case where there is a variation of a logic threshold value from an appropriate value caused by circuit characteristic variation factors (such as power supply voltage, temperatures and variations in manufacturing processes) in a signal processing circuit, since the circuit is so configured that a delay time variation factor (skew) from a logic signal converted from supplied small-amplitude signals can be removed, it is possible to feed a signal having a ratio of a period to hold a small-amplitude signal at a high level to a period to hold it at a low level, i.e., a duty-cycle ratio being appropriately maintained and having a high quality to the CMOS internal circuit. This enables the CMOS internal circuit to have a minimum logic signal to easily allow the differentiation between a high level signal and a low level signal, i.e., to have sufficient minimum pulses, leading to constantly accurate recognition of signals.

Furthermore, in the present invention, the logical threshold value in logic devices or the like constituting the receiving circuit and the amplitude center voltage of the supplied signal are detected in advance and, when the supplied signal is amplified to an arbitrary value by the amplifying circuit, a feedback signal is fed to the current generating circuit used to determine the gain of the amplifying circuit by using the feedback amplifier so that the logic threshold voltage in the logical devices or the like is equal to the amplitude center voltage of the signal to be amplified, thus allowing the removal of the delay time variation factor (skew) caused by the changes in logic threshold values in the logical devices or the like due to circuit characteristic variation factors.

Moreover, according to the output circuit of the present invention, since a small-amplitude signal being not at all affected by circuit characteristic variation factors (such as power supply voltages, temperatures and manufacturing processes) can be supplied, it is possible to supply a signal of high quality within interface specifications.

It is apparent that the present invention is not limited to the above embodiments but may be changed and modified without departing from the scope and spirit of the invention. For example, in FIG. 1, each of terminating resistors Rt is connected to each of the transmission lines and, in the embodiment, the example is provided in which operations are not terminated at the terminating voltage Vtt through these terminating resistors Rt, however, the present invention is applicable to both cases where such terminating procedures are required for interfacing or not required for the same, e.g., in the LVDS interface specifications, it does not require terminating procedures while, in the PECL interface specifications, its operations are terminated at a terminating voltage (Vtt).

Moreover, in the above second embodiment, the nMOS transistors N1, N2 and N3 are used, however, a pMOS transistor may be adopted as well.

Finally, the present application claims the priority based on Japanese Patent Application No. Hei10-347654 filed on Dec. 7, 1998, which is herein incorporation by reference.

What is claimed is:

1. An input circuit for transmitting a signal between semiconductor devices with an input stage and an output stage, said input circuit comprising:
   a threshold value detecting means to detect a threshold value of said output stage; and
   a feedback amplifier that compares the threshold value and an amplitude center level of a signal fed from said input stage to said output stage such that said amplitude center level voltage can be made equal to said threshold value detected by said threshold value detecting means.

2. The input circuit according to claim 1, wherein said threshold value detecting means of said output stage has a threshold value being equivalent to that of said output stage.

3. The input circuit according to claim 1, wherein said threshold value detecting means of said output stage is composed of a CMOS logic circuit having two or more transistors within a same integrated circuit produced by a same manufacturing processes and mounted on a same board.

4. The input circuit according to claim 3, wherein said CMOS circuit is comprised of more than one nMOS transistor and more than one pMOS transistor.

5. An input circuit according to claim 1, wherein an amplitude of an output signal fed from said input stage to said output stage is equal to or more than that of said input signal fed to said input stage.

6. An input circuit according to claim 1, wherein an amplitude of an output signal fed from said input stage to said output stage is equal to or less than that of said input signal fed to said input stage.

7. An input circuit for transmitting a signal between semiconductor devices with an input stage and an output stage, input circuit comprising:
   a threshold value detecting means to detect a threshold value of said output stage;
   whereby said threshold value of said output stage detected by said threshold value detecting means and an amplitude center level of a signal fed to said stage from said input stage are detected and compared and whereby currents to be supplied to said input stage are controlled so that both said values are equal, and an amplitude center level of a signal fed from said input stage is determined in accordance with variations in said threshold value of said output stage detected by said threshold value detecting means.

8. The input circuit according to claim 7, wherein said threshold value detecting means of said output stage has a threshold value being equivalent to that of said output stage.

9. The input circuit according to claim 7, wherein said threshold value detecting means of said output stage is composed of a CMOS logic circuit having two or more transistors within a same integrated circuit produced by a same manufacturing processes and mounted on a same board.

10. The input circuit according to claim 9, wherein said CMOS circuit is comprised of more than one nMOS transistor and more than one pMOS transistor.

11. An input circuit according to claim 7, wherein an amplitude of an output signal fed from said input stage to said output stage is equal to or more than that of said input signal fed to said input stage.

12. An input circuit according to claim 7, wherein an amplitude of an output signal fed from said input stage to said output stage is equal to or less than that of said input signal fed to said input stage.

13. An input circuit for transmitting a signal between semiconductor devices with an input stage and an output stage wherein an amplitude center level of an output signal from said input stage is converted to a level corresponding to variations in a threshold value of said output stage and the converted signal is fed to said output stage.

14. An input circuit according to claim 13, wherein an amplitude of an output signal fed from said input stage to said output stage is equal to or more than that of said input signal fed to said input stage.

15. An input circuit according to claim 13, wherein an amplitude of an output signal fed from said input stage to said output stage is equal to or less than that of said input signal fed to said input stage.

16. A method for processing an input signal in an input circuit used for transmitting a signal between semiconductor devices and provided with an input stage and an output stage, said method comprising the step of:
changing an amplitude center value of an output signal fed from said input stage to said output stage depending on variations in a threshold value of said output stage.

17. An output circuit for transmitting a signal between semiconductor devices wherein a signal fed to said output circuit is converted to a signal having a predetermined amplitude level and an amplitude center level to produce a small-amplitude signal for transmission.

18. An input-output circuit used between semiconductor devices connected through transmission lines comprising:
an output circuit for transmitting a signal between semiconductor devices wherein a signal fed to said output circuit is converted to a signal having a predetermined amplitude level and an amplitude center level to produce a small-amplitude signal for transmission;
an input circuit for transmitting a signal between semiconductor devices with an input stage and an output stage, said input circuit comprising a threshold value detecting means to detect a threshold value of said output stage;
a feedback amplifier that compares the threshold value and an amplitude center level, whereby the amplitude level of a signal fed from said input stage to said output stage is amplified in accordance with said threshold value detected by said threshold value detecting means; and
transmission lines to connect said output circuit to said input circuit.

19. An input-output circuit used between semiconductor devices connected through transmission lines comprising:
an output circuit for transmitting a signal between semiconductor devices wherein a signal fed to said output circuit is converted to a signal having a predetermined amplitude level and an amplitude center level to produce a small-amplitude signal for transmission;
an input circuit for transmitting a signal between semiconductor devices with an input stage and an output stage, comprising a threshold value detecting means to detect a threshold value of said output stage, whereby said threshold value of said output stage detected by said threshold value detecting means and an amplitude center level of a signal fed to said stage from said input stage are detected and compared and whereby currents to be supplied to said input stage are controlled so that said threshold value and amplitude center level are equal, and said amplitude center level of said signal fed from input stage is determined in accordance with variations in said threshold value of said output stage detected by said threshold value detecting means; and
transmission lines to connect said output circuit to said input circuit.

20. An input-output circuit used between semiconductor devices connected through transmission lines comprising:
an output circuit for transmitting a signal between semiconductor devices wherein a signal fed to said output circuit is converted to a signal having a predetermined amplitude level and an amplitude center level to produce a small-amplitude signal for transmission;
an input circuit for transmitting a signal between semiconductor devices with an input stage and an output stage wherein an amplitude center level of an output signal corresponding to variations in a threshold value of said output stage and the converted signal is fed to said output stage; and
transmission lines to connect said output circuit to said input circuit.

21. An input circuit for transmitting a signal between semiconductor devices, amplifying a supplied small-amplitude signal to a full-swing amplitude level being equal to or near to that of a power supply voltage and feeding it as a logic signal, said input circuit comprising:
an amplifying section to output an amplitude center voltage of said small-amplitude signal and converting said small-amplitude signal by amplification to a logic signal having a predetermined amplitude level;
a threshold value detecting means to detect a signal inversion point voltage of a CMOS logic circuit receiving an output signal from said amplifying section;
a constant current circuit to control amplification factor and amplified signal amplitude center level in said amplifying section; and
a feedback amplifier to compare a signal amplitude center voltage outputted from said amplifying section with a signal inversion point voltage of said CMOS logic circuit detected by said threshold value detecting means and to feed a voltage back to said constant current circuit so that an amplitude center level of a signal amplified by said amplifying section is equal to said signal inversion point voltage of said CMOS logic circuit.

22. The input circuit according to claim 21, wherein said threshold value detecting means has a same circuit configuration as said CMOS logic circuit, which is comprised of two or more transistors, each being mounted on a same integrated circuit and on a same board and being produced by a same manufacturing processes.

23. The input circuit according to claim 21, wherein said threshold value detecting means has a threshold value being equivalent to that of said CMOS logic circuit.

24. The input circuit according to claim 21, wherein said threshold value detecting means is composed of a CMOS logic circuit having two or more transistors within a same integrated circuit produced by a same manufacturing processes and mounted on a same board.

25. The input circuit according to claim 21, wherein said CMOS circuit is comprised of more than one nMOS transistor and more than one pMOS transistor.

26. The input circuit according to according to claim 21, wherein said CMOS circuit is a CMOS inverter circuit.

27. An input circuit for transmitting a signal between semiconductor devices, amplifying a supplied small-amplitude signal to a full-swing amplitude level being equal to or near to that of a power supply voltage and feeding it as a logic signal, said input circuit comprising:

an amplitude center voltage detecting means to detect the amplitude center level of said small-amplitude signal;

an amplifying circuit to convert said small-amplitude signal by amplification to a logic signal having a predetermined amplitude level;

a constant current circuit to control amplification factor and amplified signal amplitude center level in said amplifying circuit;

a CMOS logic circuit to convert a signal amplified by said amplifying circuit to said logic signal;

a threshold value detecting means to a signal inversion point voltage of said CMOS logic circuit; and a feedback amplifier to compare an amplitude center level detected by said amplitude center voltage detecting means with a signal inversion point voltage of said CMOS logic circuit detected by said threshold value detecting means and to feed a voltage back to said constant current circuit so that an amplitude center voltage of a signal to be amplified by said amplifying circuit is equal to a signal inversion point voltage of said CMOS logic circuit.

28. The input circuit according to claim 27, wherein said threshold value detecting means has a same circuit configuration as said CMOS logic circuit, which is comprised of two or more transistors, each being mounted on a same integrated circuit and on a same board and being produced by a same manufacturing processes.

29. The input circuit according to claim 27, wherein said threshold value detecting means has a threshold value being equivalent to that of said CMOS logic circuit.

30. The input circuit according to claim 27, wherein said threshold value detecting means is composed of a CMOS logic circuit having two or more transistors within a same integrated circuit produced by a same manufacturing processes and mounted on a same board.

31. The input circuit according to claim 27, wherein said CMOS circuit is comprised of more than one nMOS transistor and more than one pMOS transistor.

32. The input circuit according to according to claim 27, wherein said CMOS circuit is a CMOS inverter circuit.

33. An input circuit for transmitting a signal between semiconductor devices, amplifying a supplied small-amplitude signal to a full-swing amplitude level being equal to or near to that of a power supply voltage and feeding it as a logic signal, said input circuit comprising:

a level conversion circuit to control a center level of said small-amplitude signal;

an amplitude center voltage detecting means to detect an amplitude center level of a signal fed from said level conversion circuit;

a threshold value detecting means to detect a signal inversion point voltage of a CMOS logic circuit receiving an output signal from said level conversion circuit;

a constant current circuit to control amounts of voltage to be shifted by said level conversion circuit; and a feedback amplifier to compare an amplitude center voltage outputted by said level conversion circuit with a signal inversion point voltage of said CMOS logic circuit detected by said threshold value detecting means and to feed a voltage back to said constant current circuit so that an amplitude center voltage outputted from said level conversion circuit is equal to a signal inversion point voltage of said CMOS logic circuit.

34. The input circuit according to claim 33, wherein said threshold value detecting means has a same circuit configuration as said CMOS logic circuit, which is comprised of two or more transistors, each being mounted on a same integrated circuit and on a same board and being produced by a same manufacturing processes.

35. The input circuit according to claim 33, wherein said threshold value detecting means has a threshold value being equivalent to that of said CMOS logic circuit.

36. The input circuit according to claim 33, wherein said threshold value detecting means is composed of a CMOS logic circuit having two or more transistors within a same integrated circuit produced by a same manufacturing processes and mounted on a same board.

37. The input circuit according to claim 33, wherein said CMOS circuit is comprised of more than one nMOS transistor and more than one pMOS transistor.

38. The input circuit according to according to claim 33, wherein said CMOS circuit is a CMOS inverter circuit.

39. An input circuit for transmitting a signal between semiconductor devices, amplifying a supplied small-amplitude signal to a full-swing amplitude level being equal to or near to that of a power supply voltage and feeding it as a logic signal, said input circuit comprising:

a level conversion circuit to control a center level of said small-amplitude signal;

an amplitude center voltage detecting means to detect a signal amplitude center voltage supplied from said level conversion circuit;

a mos logic circuit to convert a signal having a level shifted by said level conversion circuit to said logic signal;

a threshold value detecting means to detect a signal inversion point voltage of said CMOS logic circuit;

a constant current circuit to control amounts of voltage to be shifted by said level conversion circuit; and a feedback amplifier to compare an amplitude center voltage outputted by said amplitude center voltage detecting means with a signal inversion point voltage of said CMOS logic circuit detected by said threshold value detecting means and to feed a voltage back to said constant current circuit so that an amplitude center voltage outputted from said level conversion circuit is equal to a signal inversion point voltage of said CMOS logic circuit.

40. The input circuit according to claim 39, wherein said threshold value detecting means has a same circuit configuration as said CMOS logic circuit, which is comprised of two or more transistors, each being mounted on a same integrated circuit and on a same board and being produced by a same manufacturing processes.

41. The input circuit according to claim 39, wherein said threshold value detecting means has a threshold value being equivalent to that of said CMOS logic circuit.

42. The input circuit according to claim 39, wherein said threshold value detecting means is composed of a CMOS logic circuit having two or more transistors within a same integrated circuit produced by a same manufacturing processes and mounted on a same board.

43. The input circuit according to claim 39, wherein said CMOS circuit is comprised of more than one nMOS transistor and more than one pMOS transistor.

44. The input circuit according to according to claim 39, wherein said CMOS circuit is a CMOS inverter circuit.

45. An output circuit for transmitting a signal between semiconductor devices, converting a su supplied input signal to a small-amplitude transmission signal on the basis of a specified small-amplitude interfacing specifications and feeding it, said output circuit comprising:
   a constant voltage generating means to generate a voltage used to set an output center level of said small-amplitude transmission signal;
   an output section to detect an output center level from said output transmission signal and to convert an amplitude of said output transmission signal to a predetermined amplitude; and
   a feedback amplifier to compare an output center level outputted by a constant voltage circuit used to shift an output center level of said supplied transmission signal and by said output section with a voltage generated by said constant voltage generating means and to feed a voltage back to said constant current circuit so that an output center level of a small-amplitude signal outputted from said output section is equal to a voltage value set by said constant voltage generating means.

46. An output circuit for transmitting a signal between semiconductor devices, converting a supplied input signal to a small-amplitude transmission signal on the basis of a specified small-amplitude interfacing specifications and feeding it, said output circuit comprising:
   a reference voltage generating means used to produce an output center level voltage of said small-amplitude transmission signal;
   an output center voltage detecting means to detect an output center level from said output transmission signal;
   a constant voltage circuit used to shift an output center level of said output transmission signal;
   a feedback amplifier to compare an output center level detected by said output center voltage detecting means with a voltage generated by said reference voltage generating means and to feed a voltage back to said constant current circuit so that an output center level of said output transmission signal is equal to a voltage value set by said reference voltage generating means; and
   an amplitude level changing means to convert an amplitude of said supplied input signal to a predetermined small-amplitude level.

47. An input-output circuit used between semiconductor devices connected through transmission lines comprising:
   an input circuit for transmitting a signal between semiconductor devices, amplifying a supplied small-amplitude signal to a fill-swing amplitude level being equal to or near to that of a power supply voltage and feeding it as a logic signal, said input circuit comprising:
      an amplifying section to output an amplitude center voltage of said small-amplitude signal and converting said small-amplitude signal by amplification to a logic signal having a predetermined amplitude level;
      a threshold value detecting means to detect a signal inversion point voltage of a CMOS logic circuit receiving an output signal from said amplifying section;
      a constant current circuit to control amplification factor and amplified signal amplitude center level in said amplifying section; and
      a feedback amplifier to compare a signal amplitude center voltage outputted from said amplifying section with a signal inversion point voltage of said CMOS logic circuit detected by said threshold value detecting means and to feed a voltage back to said constant current circuit so that an amplitude center level of a signal amplified by said amplifying section is equal to said signal inversion point voltage of said CMOS logic circuit;
   an output circuit for transmitting a signal between semiconductor devices, converting a supplied input signal to a small-amplitude transmission signal on the basis of a specified small-amplitude interfacing specifications and feeding it, said output circuit comprising:
      a constant voltage generating means to generate a voltage used to set an output center level of said small-amplitude transmission signal;
      an output section to detect an output center level from said output transmission signal and to convert an amplitude of said output transmission signal to a predetermined amplitude; and
      a feedback amplifier to compare an output center level outputted by a constant voltage circuit used to shift an output center level of said supplied transmission signal and by said output section with a voltage generated by said constant voltage generating means and to feed a voltage back to said constant current circuit so that an output center level of a smallamplitude signal outputted from said output section is equal to a voltage value set by said constant voltage generating means; and
   transmission lines to connect said output circuit to said input circuit.

48. An input-output circuit used between semiconductor devices connected through transmission lines comprising:
   an input circuit for transmitting a signal between semiconductor devices, amplifying a supplied small-amplitude signal to a full-swing amplitude level being equal to or near to that of a power supply voltage and feeding it as a logic signal, said input circuit comprising:
      an amplitude center voltage detecting means to detect the amplitude center level of said small-amplitude signal;
      an amplifying circuit to convert said small-amplitude signal by amplification to a logic signal having a predetermined amplitude level;
      a constant current circuit to control amplification factor and amplified signal amplitude center level in said amplifying circuit;
      a CMOS logic circuit to convert a signal amplified by said amplifying circuit to said logic signal;
      a threshold value detecting means to a signal inversion point voltage of said CMOS logic circuit; and
      a feedback amplifier to compare an amplitude center level detected by said amplitude center voltage detecting means with a signal inversion point voltage of said CMOS logic circuit detected by said threshold value detecting means and to feed a voltage back to said constant current circuit so that an amplitude center voltage of a signal to be amplified by said amplifying circuit is equal to a signal inversion point voltage of said CMOS logic circuit;
   an output circuit for transmitting a signal between semiconductor devices, converting a supplied input signal to a small-amplitude transmission signal on the basis of a specified small-amplitude interfacing specifications and feeding it, said output circuit comprising:
  a constant voltage generating means to generate a voltage used to set an output center level of said small-amplitude transmission signal;
  an output section to detect an output center level from said output transmission signal and to convert an amplitude of said output transmission signal to a predetermined amplitude; and
  a feedback amplifier to compare an output center level outputted by a constant voltage circuit used to shift an output center level of said supplied transmission signal and by said output section with a voltage generated by said constant voltage generating means and to feed a voltage back to said constant current circuit so that an output center level of a small-amplitude signal outputted from said output section is equal to a voltage value set by said constant voltage generating means; and
transmission lines to connect said output circuit to said input circuit.

49. An input-output circuit used between semiconductor devices connected through transmission lines comprising:
  an input circuit for transmitting a signal between semiconductor devices, amplifying a supplied small-amplitude signal to a full-swing amplitude level being equal to or near to that of a power supply voltage and feeding it as a logic signal, said input circuit comprising:
    a level conversion circuit to control a center level of said small-amplitude signal;
    an amplitude center voltage detecting means to an amplitude center level of a signal fed from said level conversion circuit;
    a threshold value detecting means to detect a signal inversion point voltage of a CMOS logic circuit receiving an output signal from said level conversion circuit;
    a constant current circuit to control amounts of voltage to be shifted by said level conversion circuit; and
    a feedback amplifier to compare an amplitude center voltage outputted by said level conversion circuit with a signal inversion point voltage of said CMOS logic circuit detected by said threshold value detecting means and to feed a voltage back to said constant current circuit so that an amplitude center voltage outputted from said level conversion circuit is equal to a signal inversion point voltage of said CMOS logic circuit;
  an output circuit for transmitting a signal between semiconductor devices, converting a supplied input signal to a small-amplitude transmission signal on the basis of a specified small-amplitude interfacing specifications and feeding it, said output circuit comprising:
    a constant voltage generating means to generate a voltage used to set an output center level of said small-amplitude transmission signal;
    an output section to detect an output center level from said output transmission signal and to convert an amplitude of said output transmission signal to a predetermined amplitude; and
    a feedback amplifier to compare an output center level outputted by a constant voltage circuit used to shift an output center level of said supplied transmission signal and by said output section with a voltage generated by said constant voltage generating means and to feed a voltage back to said constant current circuit so that an output center level of a small-amplitude signal outputted from said output section is equal to a voltage value set by said constant voltage generating means; and
  transmission lines to connect said output circuit to said input circuit.

50. An input-output circuit used between semiconductor devices connected through transmission lines comprising:
  an input circuit for transmitting a signal between semiconductor devices, amplifying a supplied small-amplitude signal to a full-swing amplitude level being equal to or near to that of a power supply voltage and feeding it as a logic signal, said input circuit comprising:
    a level conversion circuit to control a center level of said small-amplitude signal;
    an amplitude center voltage detecting means to detect a signal amplitude center voltage supplied from said level conversion circuit;
    a CMOS logic circuit to convert a signal having a level shifted by said level conversion circuit to said logic signal;
    a threshold value detecting means to detect a signal inversion point voltage of said CMOS logic circuit;
    a constant current circuit to control amounts of voltage to be shifted by said level conversion circuit; and
    a feedback amplifier to compare an amplitude center voltage outputted by said amplitude center voltage detecting means with a signal inversion point voltage of said CMOS logic circuit detected by said threshold value detecting means and to feed a voltage back to said constant current circuit so that an amplitude center voltage outputted from said level conversion circuit is equal to a signal inversion point voltage of said CMOS logic circuit;
  an output circuit for transmitting a signal between semiconductor devices, converting a supplied input signal to a small-amplitude transmission signal on the basis of a specified small-amplitude interfacing specifications and feeding it, said output circuit comprising:
    a constant voltage generating means to generate a voltage used to set an output center level of said small-amplitude transmission signal;
    an output section to detect an output center level from said output transmission signal and to convert an amplitude of said output transmission signal to a predetermined amplitude; and
    a feedback amplifier to compare an output center level outputted by a constant voltage circuit used to shift an output center level of said supplied transmission signal and by said output section with a voltage generated by said constant voltage generating means and to feed a voltage back to said constant current circuit so that an output center level of a smallamplitude signal outputted from said output section is equal to a voltage value set by said constant voltage generating means; and
  transmission lines to connect said output circuit to said input circuit.

51. An input-output circuit used between semiconductor devices connected through transmission lines comprising:
  an input circuit for transmitting a signal between semiconductor devices, amplifying a supplied small-amplitude signal to a full-swing amplitude level being equal to or near to that of a power supply voltage and feeding it as a logic signal, said input circuit comprising:

an amplifying section to output an amplitude center voltage of said small-amplitude signal and converting said small-amplitude signal by amplification to a logic signal having a predetermined amplitude level;

a threshold value detecting means to detect a signal inversion point voltage of a CMOS logic circuit receiving an output signal from said amplifying section;

a constant current circuit to control amplification factor and amplified signal amplitude center level in said amplifying section; and a feedback amplifier to compare a signal amplitude center voltage outputted from said amplifying section with a signal inversion point voltage of said CMOS logic circuit detected by said threshold value detecting means and to feed a voltage back to said constant current circuit so that an amplitude center level of a signal amplified by said amplifying section is equal to said signal inversion point voltage of said CMOS logic circuit;

an output circuit for transmitting a signal between semiconductor devices, converting a supplied input signal to a small-amplitude transmission signal on the basis of a specified small-amplitude interfacing specifications and feeding it, said output circuit comprising:

a reference voltage generating means used to produce an output center level voltage of said small-amplitude transmission signal;

an output center voltage detecting means to detect an output center level from said output transmission signal;

a constant voltage circuit used to shift an output center level of said output transmission signal;

a feedback amplifier to compare an output center level detected by said output center voltage detecting means with a voltage generated by said reference voltage generating means and to feed a voltage back to said constant current circuit so that an output center level of said output transmission signal is equal to a voltage value set by said reference voltage generating means; and an amplitude level changing means to convert an amplitude of said supplied input signal to a predetermined small-amplitude level; and transmission lines to connect said output circuit to said input circuit.

52. An input-output circuit used between semiconductor devices connected through transmission lines comprising:

an input circuit for transmitting a signal between semiconductor devices, amplifying a supplied small-amplitude signal to a full-swing amplitude level being equal to or near to that of a power supply voltage and feeding it as a logic signal, said input circuit comprising:

an amplitude center voltage detecting means to detect the amplitude center level of said small-amplitude signal;

an amplifying circuit to convert said small-amplitude signal by amplification to a logic signal having a predetermined amplitude level;

a constant current circuit to control amplification factor and amplified signal amplitude center level in said amplifying circuit;

a CMOS logic circuit to convert a signal amplified by said amplifying circuit to said logic signal;

a threshold value detecting means to a signal inversion point voltage of said CMOS logic circuit; and a feedback amplifier to compare an amplitude center level detected by said amplitude center voltage detecting means with a signal inversion point voltage of said CMOS logic circuit detected by said threshold value detecting means and to feed a voltage back to said constant current circuit so that an amplitude center voltage of a signal to be amplified by said amplifying circuit is equal to a signal inversion point voltage of said CMOS logic circuit;

an output circuit for transmitting a signal between semiconductor devices, converting a supplied input signal to a small-amplitude transmission signal on the basis of a specified small-amplitude interfacing specifications and feeding it, said output circuit comprising:

a reference voltage generating means used to produce an output center level voltage of said small-amplitude transmission signal;

an output center voltage detecting means to detect an output center level from said output transmission signal;

a constant voltage circuit used to shift an output center level of said output transmission signal;

a feedback amplifier to compare an output center level detected by said output center voltage detecting means with a voltage generated by said reference voltage generating means and to feed a voltage back to said constant current circuit so that an output center level of said output transmission signal is equal to a voltage value set by said reference voltage generating means; and an amplitude level changing means to convert an amplitude of said supplied input signal to a predetermined small-amplitude level; and transmission lines to connect said output circuit to said input circuit.

53. An input-output circuit used between semiconductor devices connected through transmission lines comprising:

an input circuit for transmitting a signal between semiconductor devices, amplifying a supplied small-amplitude signal to a full-swing amplitude level being equal to or near to that of a power supply voltage and feeding it as a logic signal, said input circuit comprising:

a level conversion circuit to control a center level of said small-amplitude signal;

an amplitude center voltage detecting means to an amplitude center level of a signal fed from said level conversion circuit;

a threshold value detecting means to detect a signal inversion point voltage of a CMOS logic circuit receiving an output signal from said level conversion circuit;

a constant current circuit to control amounts of voltage to be shifted by said level conversion circuit; and a feedback amplifier to compare an amplitude center voltage outputted by said level conversion circuit with a signal inversion point voltage of said CMOS logic circuit detected by said threshold value detecting means and to feed a voltage back to said constant current circuit so that an amplitude center voltage outputted from said level conversion circuit is equal to a signal inversion point voltage of said CMOS logic circuit;

an output circuit for transmitting a signal between semiconductor devices, converting a supplied input signal to a small-amplitude transmission signal on the basis of a specified small-amplitude interfacing specifications and feeding it, said output circuit comprising:

a reference voltage generating means used to produce an output center level voltage of said small-amplitude transmission signal;

an output center voltage detecting means to detect an output center level from said output transmission signal;

a constant voltage circuit used to shift an output center level of said output transmission signal;

a feedback amplifier to compare an output center level detected by said output center voltage detecting means with a voltage generated by said reference voltage generating means and to feed a voltage back to said constant current circuit so that an output center level of said output transmission signal is equal to a voltage value set by said reference voltage generating means; and an amplitude level changing means to convert an amplitude of said supplied input signal to a predetermined small-amplitude level; and transmission lines to connect said output circuit to said input circuit.

54. An input-output circuit used between semiconductor devices connected through transmission lines comprising:

an input circuit for transmitting a signal between semiconductor devices, amplifying a supplied small-amplitude signal to a full-swing amplitude level being equal to or near to that of a power supply voltage and feeding it as a logic signal, said input circuit comprising:

a level conversion circuit to control a center level of said small-amplitude signal;

an amplitude center voltage detecting means to detect a signal amplitude center voltage supplied from said level conversion circuit;

a CMOS logic circuit to convert a signal having a level shifted by said level conversion circuit to said logic signal;

a threshold value detecting means to detect a signal inversion point voltage of said CMOS logic circuit;

a constant current circuit to control amounts of voltage to be shifted by said level conversion circuit; and a feedback amplifier to compare an amplitude center voltage outputted by said amplitude center voltage detecting means with a signal inversion point voltage of said CMOS logic circuit detected by said threshold value detecting means and to feed a voltage back to said constant current circuit so that an amplitude center voltage outputted from said level conversion circuit is equal to a signal inversion point voltage of said CMOS logic circuit;

an output circuit for transmitting a signal between semiconductor devices, converting a supplied input signal to a small-amplitude transmission signal on the basis of a specified small-amplitude interfacing specifications and feeding it, said output circuit comprising:

a reference voltage generating means used to produce an output center level voltage of said small-amplitude transmission signal;

an output center voltage detecting means to detect an output center level from said output transmission signal;

a constant voltage circuit used to shift an output center level of said output transmission signal;

a feedback amplifier to compare an output center level detected by said output center voltage detecting means with a voltage generated by said reference voltage generating means and to feed a voltage back to said constant current circuit so that an output center level of said output transmission signal is equal to a voltage value set by said reference voltage generating means; and an amplitude level changing means to convert an amplitude of said supplied input signal to a predetermined small-amplitude level; and transmission lines to connect said output circuit to said input circuit.

\* \* \* \* \*